(12) United States Patent
Yamaguchi et al.

(10) Patent No.: US 10,545,018 B2
(45) Date of Patent: Jan. 28, 2020

(54) PATTERN MEASUREMENT DEVICE, AND COMPUTER PROGRAM FOR MEASURING PATTERN

(71) Applicant: Hitachi High-Technologies Corporation, Minato-ku, Tokyo (JP)

(72) Inventors: Satoru Yamaguchi, Tokyo (JP); Norio Hasegawa, Tokyo (JP); Akiyuki Sugiyama, Tokyo (JP); Miki Isawa, Tokyo (JP); Akihiro Onizawa, Tokyo (JP); Ryuji Mitsuhashi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/104,574

(22) PCT Filed: Nov. 17, 2014

(86) PCT No.: PCT/JP2014/080288
§ 371 (c)(1),
(2) Date: Jun. 15, 2016

(87) PCT Pub. No.: WO2015/098350
PCT Pub. Date: Jul. 2, 2015

(65) Prior Publication Data
US 2016/0320182 A1 Nov. 3, 2016

(30) Foreign Application Priority Data

Dec. 27, 2013 (JP) ................................. 2013-270795

(51) Int. Cl.
*G01B 15/00* (2006.01)
*H01L 21/66* (2006.01)
(Continued)

(52) U.S. Cl.
CPC .............. *G01B 15/00* (2013.01); *H01J 37/28* (2013.01); *H01L 21/0335* (2013.01);
(Continued)

(58) Field of Classification Search
CPC . G01B 15/00; G01B 2210/56; H01L 21/0338; H01L 21/0337; H01L 21/0335; H01L 22/12; H01J 37/28; H01J 2237/2817
(Continued)

(56) References Cited

U.S. PATENT DOCUMENTS 8,148,682 B2 4/2012 Hotta et al.
2010/0299646 A1 11/2010 Pierrat
(Continued)

FOREIGN PATENT DOCUMENTS

JP 2011-137901 A 7/2011
TW 201140255 A 11/2011
(Continued)

OTHER PUBLICATIONS

Chinese-language Office Action issued in counterpart Taiwan Application No. 103140648 dated May 9, 2016 (7 pages).
(Continued)

*Primary Examiner* — Michael Maskell
(74) *Attorney, Agent, or Firm* — Crowell & Moring LLP

(57) ABSTRACT

The purpose of the present invention is to provide a pattern measurement device which adequately evaluates a pattern formed by means of a patterning method for forming a pattern that is not in a photomask. In order to fulfil the purpose, the present invention suggests a pattern measurement device provided with a computation device for measuring the dimensions between patterns formed on a sample, wherein: the centroid of the pattern formed on the sample is extracted from data to be measured obtained by irradiating beams; a position alignment process is executed between the extracted centroid and measurement reference data in which a reference functioning as the measurement start point or measurement end point is set; and the dimensions between the measurement start point or the measurement end point of the measurement reference data, which was subjected to position alignment, and the edge or the centroid of the pattern contained in the data to be measured is measured.

11 Claims, 37 Drawing Sheets

(51) Int. Cl.
*H01J 37/28* (2006.01)
*H01L 21/033* (2006.01)

(52) U.S. Cl.
CPC ...... *H01L 21/0337* (2013.01); *H01L 21/0338* (2013.01); *H01L 22/12* (2013.01); *G01B 2210/56* (2013.01); *H01J 2237/2817* (2013.01)

(58) Field of Classification Search
USPC .................................. 250/306, 307, 310, 311
See application file for complete search history.

(56) References Cited

U.S. PATENT DOCUMENTS

| | | |
|---|---|---|
| 2012/0053892 A1 | 3/2012 | Matsuoka et al. |
| 2012/0290990 A1 | 11/2012 | Toyoda et al. |
| 2014/0320627 A1* | 10/2014 | Miyamoto .......... G03F 7/70633 348/80 |
| 2015/0136976 A1* | 5/2015 | Matsuoka ............. H01J 37/222 250/306 |

FOREIGN PATENT DOCUMENTS

| | | |
|---|---|---|
| TW | 201346983 A | 11/2013 |
| WO | WO 2013/118613 A1 | 8/2013 |

OTHER PUBLICATIONS

International Search Report (PCT/ISA/210) issued in PCT Application No. PCT/JP2014/080288 dated Feb. 24, 2015, with English translation (six (6) pages).

Hidetami Yaegashi et al., "Novel approaches to implement the self-aligned spacer double-patterning process toward 11-nm node and beyond", Proc. Of SPIE, 2011, vol. 7972, pp. 79720B-1 to 79720B-7.

Benjamen Rathsack et al., "Pattern Scaling with Directed Self Assembly Through Lithography and Etch Process Integration", Proc. Of SPIE, 2012, vol. 8323, pp. 83230B-1 to 83230B-14.

* cited by examiner

[Fig. 1]
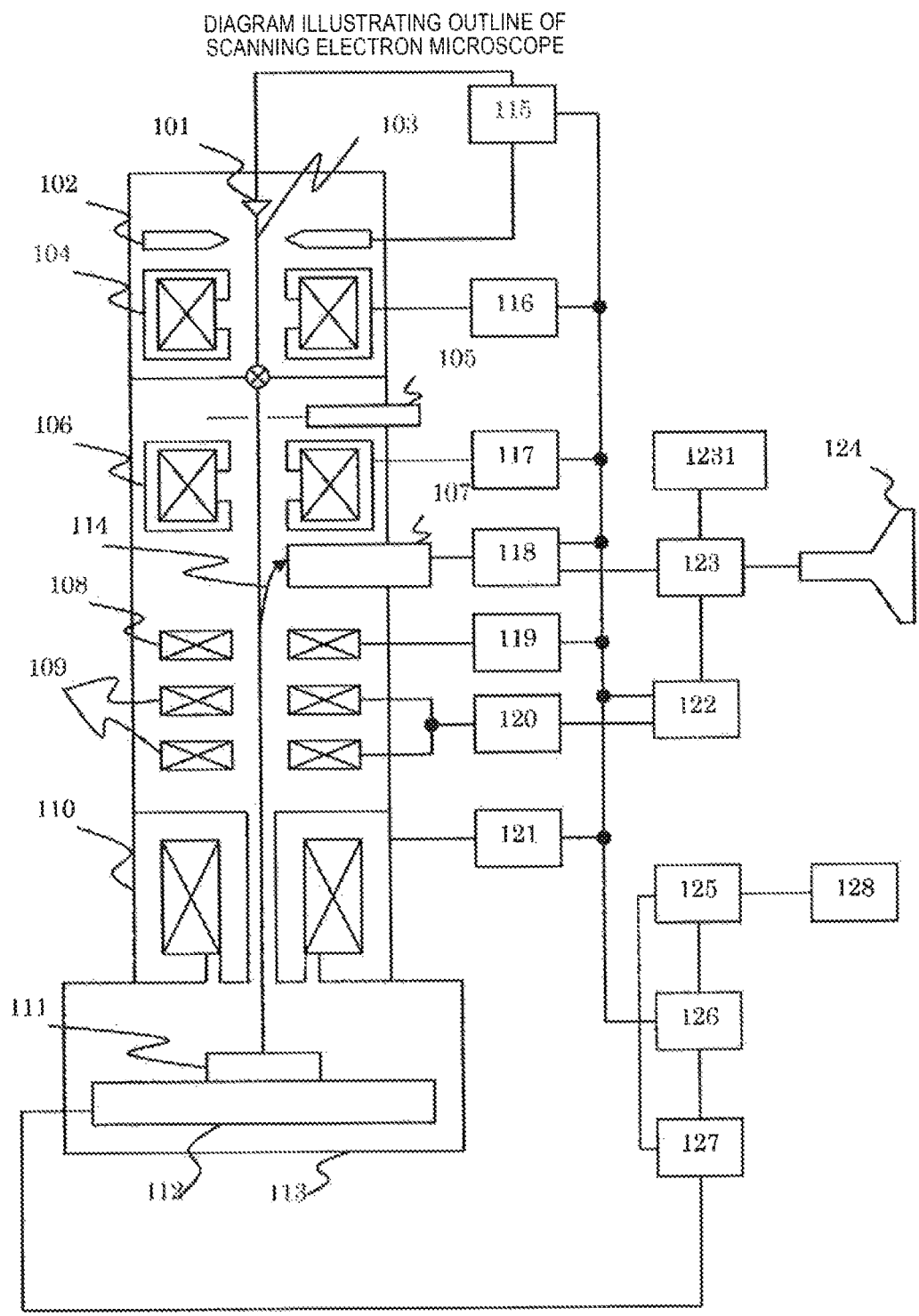

[Fig. 2]

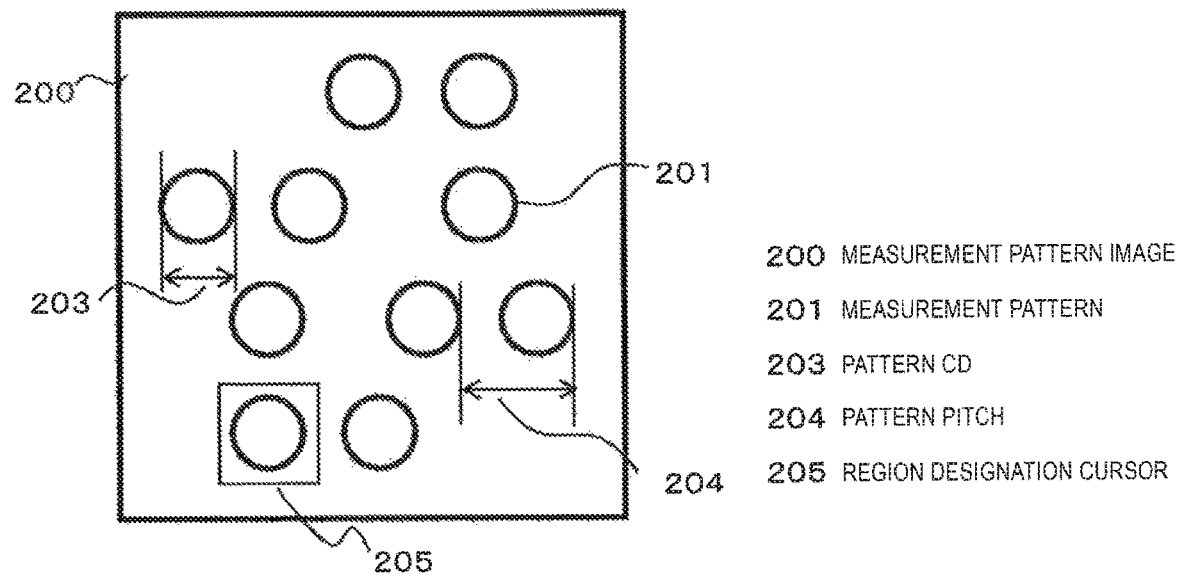

200 MEASUREMENT PATTERN IMAGE
201 MEASUREMENT PATTERN
203 PATTERN CD
204 PATTERN PITCH
205 REGION DESIGNATION CURSOR

[Fig. 3]

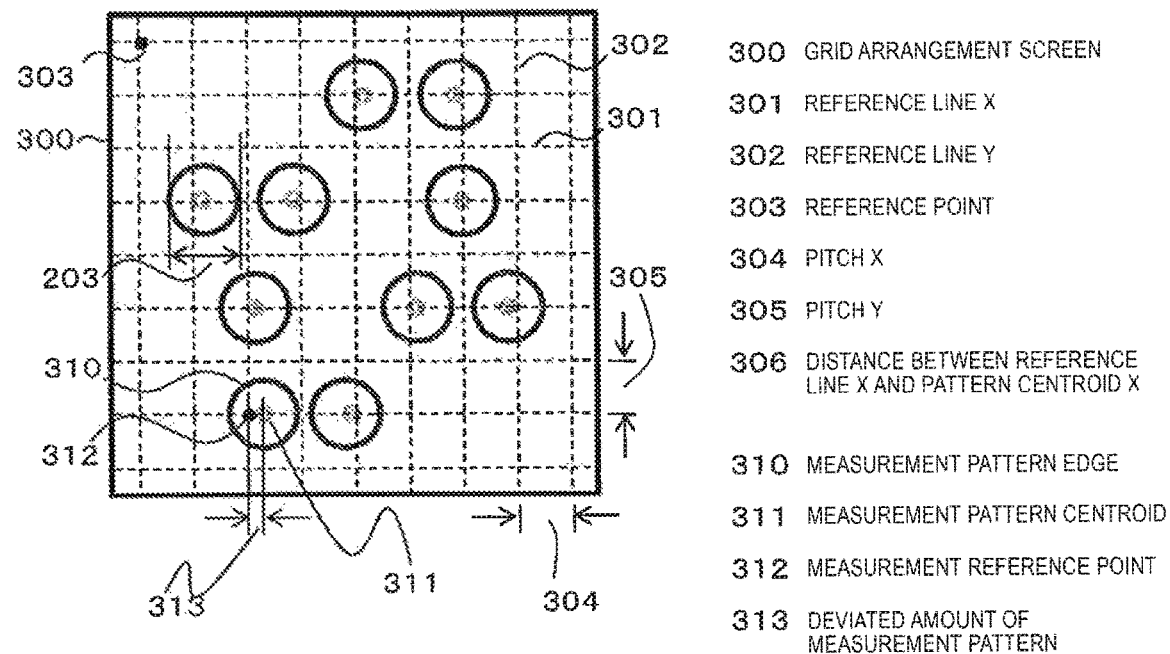

300 GRID ARRANGEMENT SCREEN
301 REFERENCE LINE X
302 REFERENCE LINE Y
303 REFERENCE POINT
304 PITCH X
305 PITCH Y
306 DISTANCE BETWEEN REFERENCE LINE X AND PATTERN CENTROID X
310 MEASUREMENT PATTERN EDGE
311 MEASUREMENT PATTERN CENTROID
312 MEASUREMENT REFERENCE POINT
313 DEVIATED AMOUNT OF MEASUREMENT PATTERN

[Fig. 4]
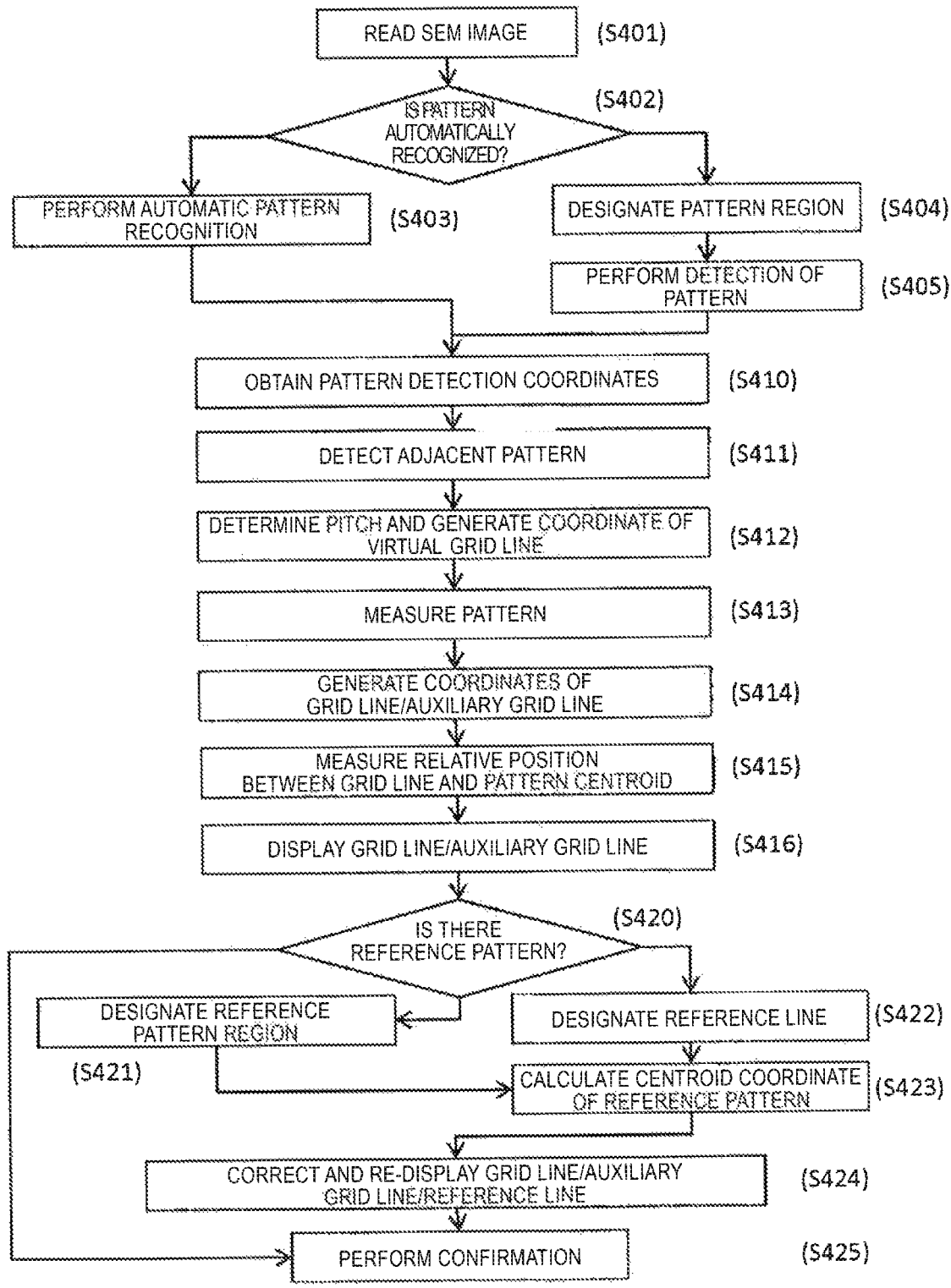

[Fig. 5]
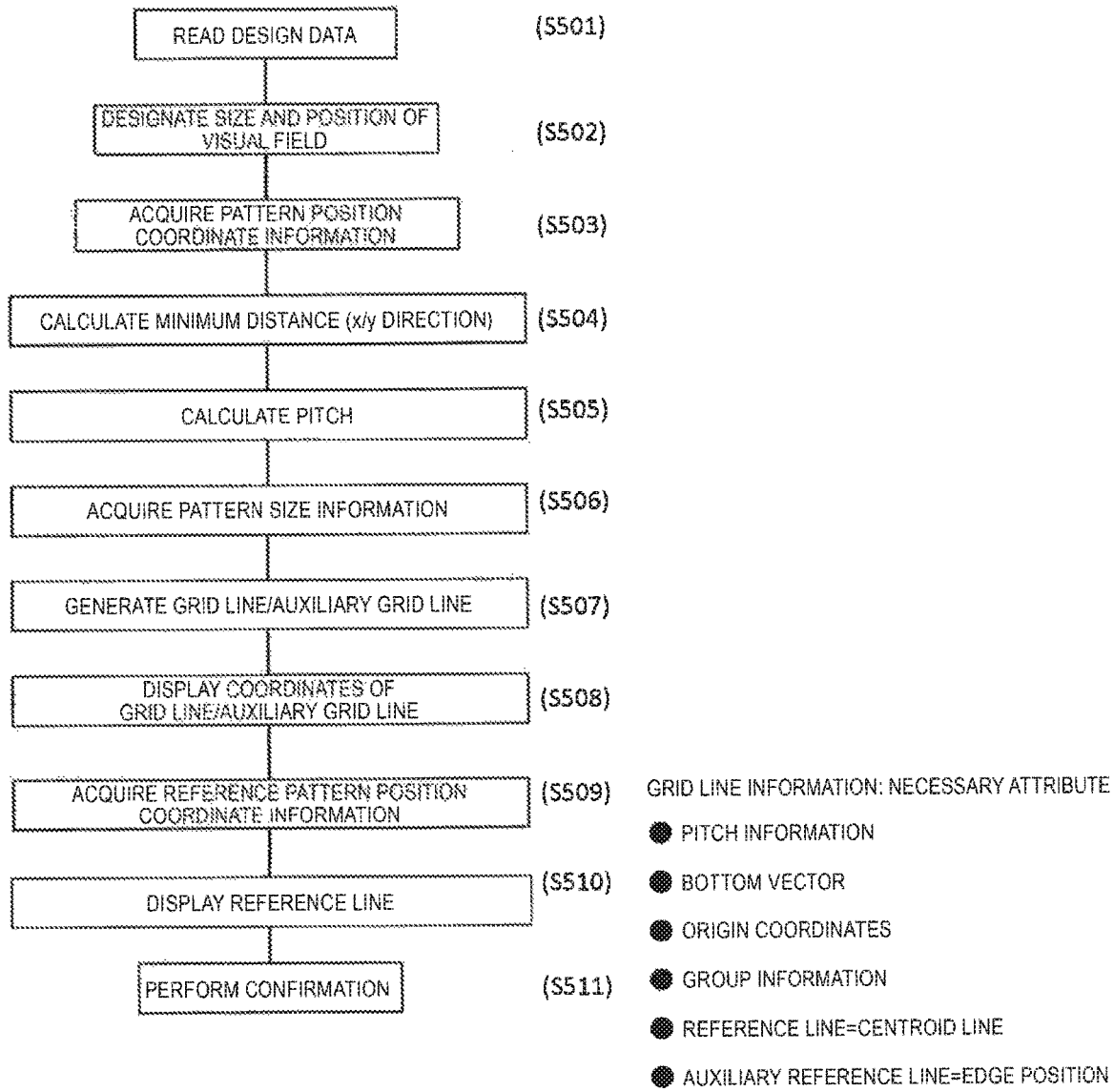

[Fig. 6]
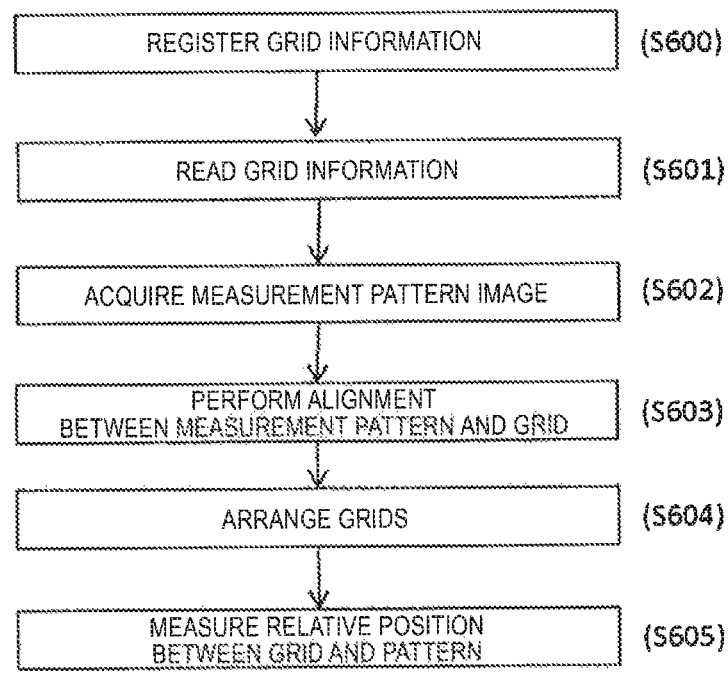

[Fig. 7]
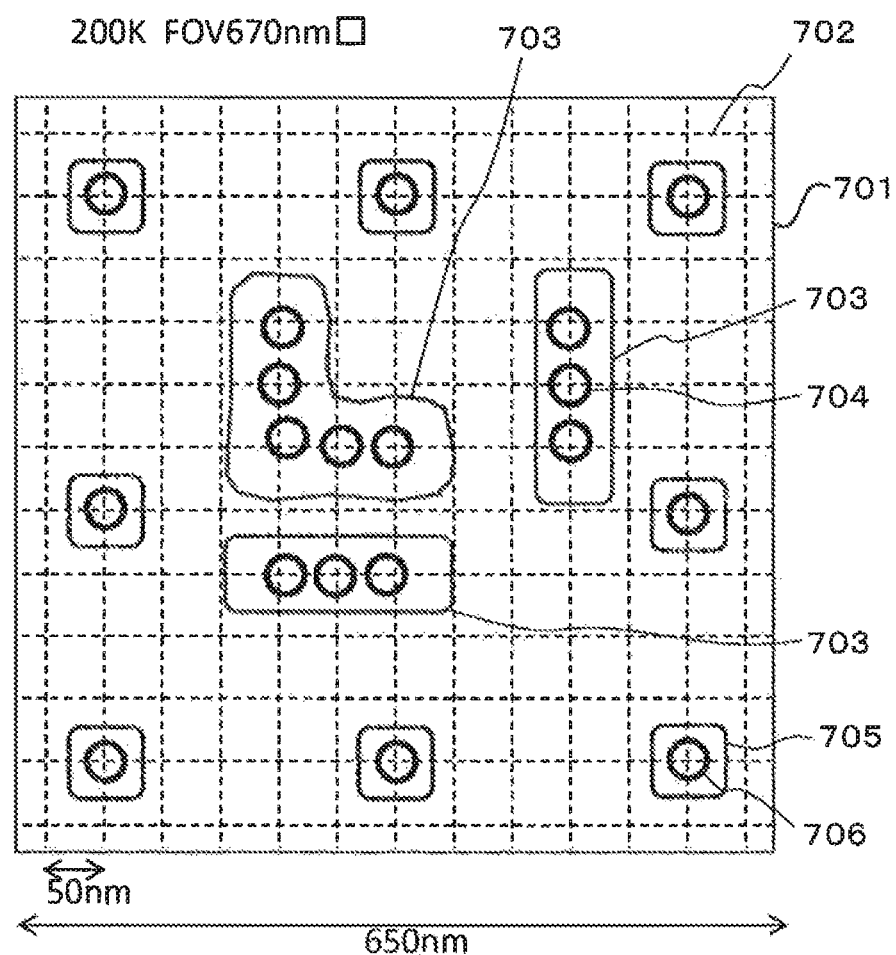

[Fig. 8]
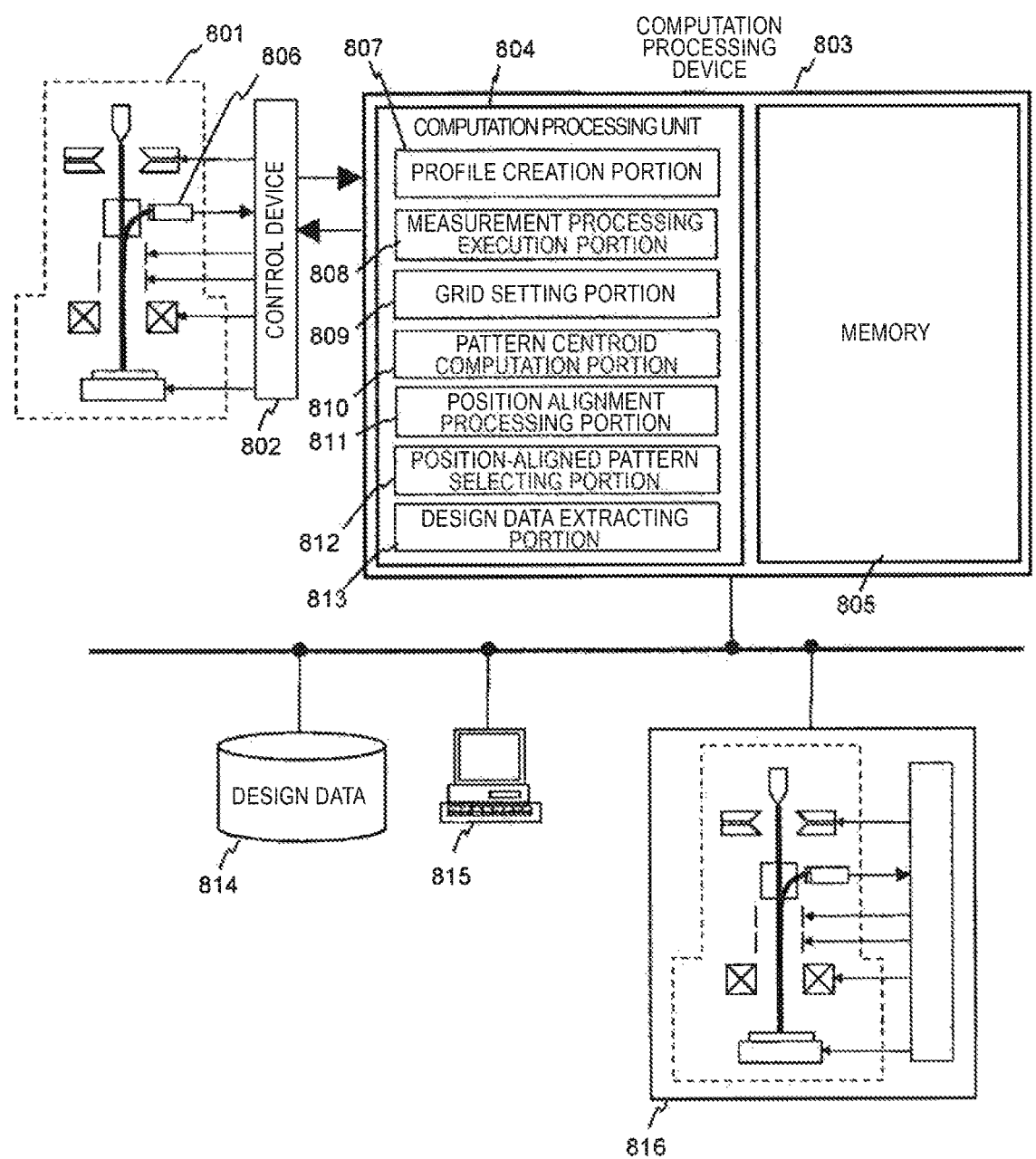

[Fig. 9]
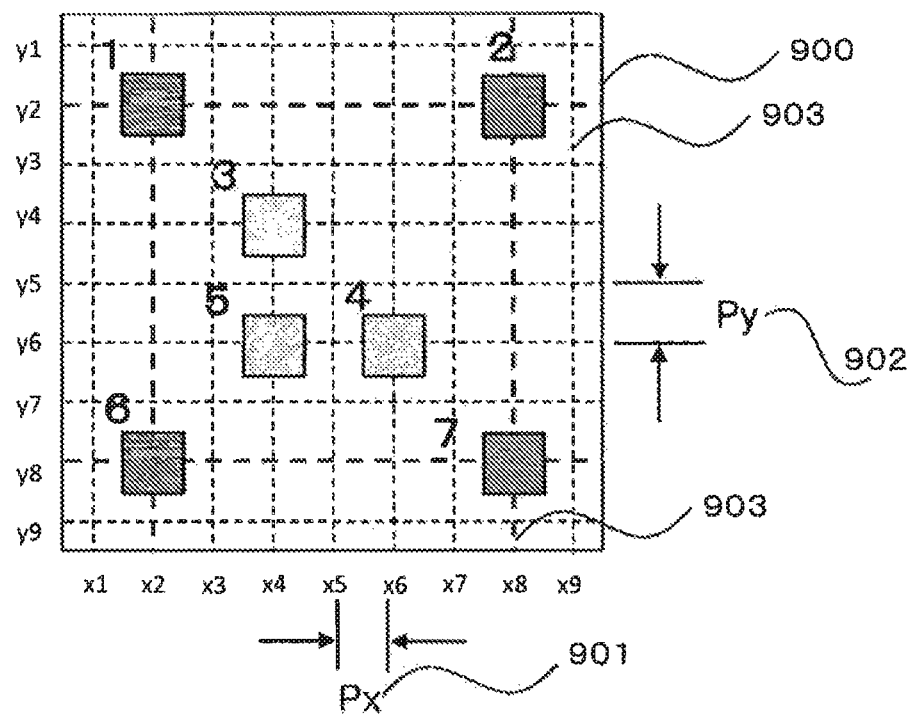
[Fig. 10]
| Pattern No. | Group No. | Design | Mask | Guide Pattern | Meas. Pattern |
|---|---|---|---|---|---|
| 1 | 1 | (x2,y2) | (x2,y2) | (x2,y2) | (x2,y2) |
| 2 | 1 | (x8,y2) | (x8,y2) | (x8,y2) | (x8,y2) |
| 3 | 2 | (x4,y4) | - | - | (x4,y4) |
| 4 | 2 | (x4,y6) | - | - | (x4,y6) |
| 5 | 2 | (x6,y6) | - | - | (x6,y6) |
| 6 | 1 | (x2,y8) | (x2,y8) | (x2,y8) | (x2,y8) |
| 7 | 1 | (x8,y8) | (x8,y8) | (x8,y8) | (x8,y8) |

[Fig. 11]
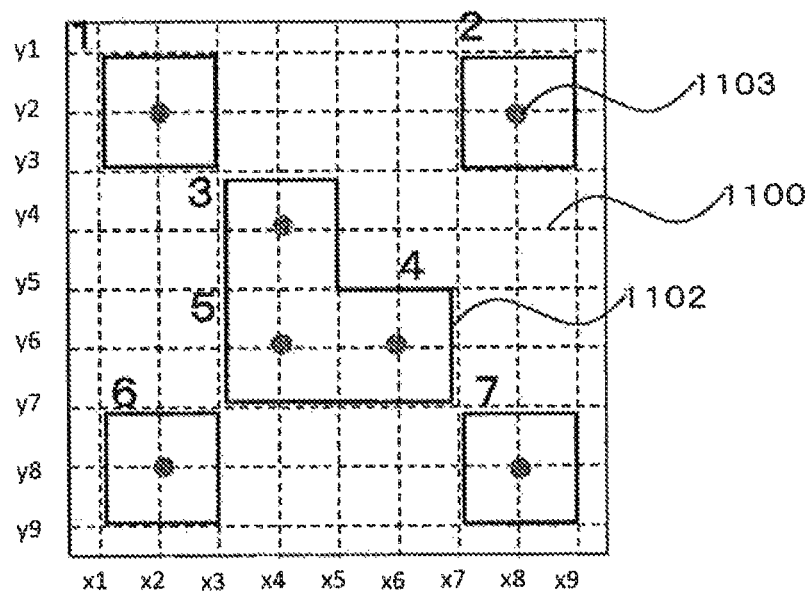
[Fig. 12]
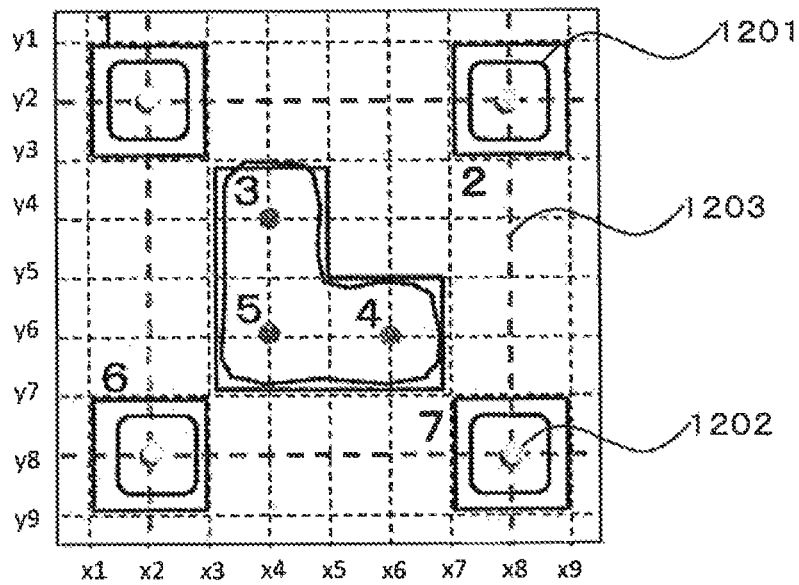

[Fig. 13]
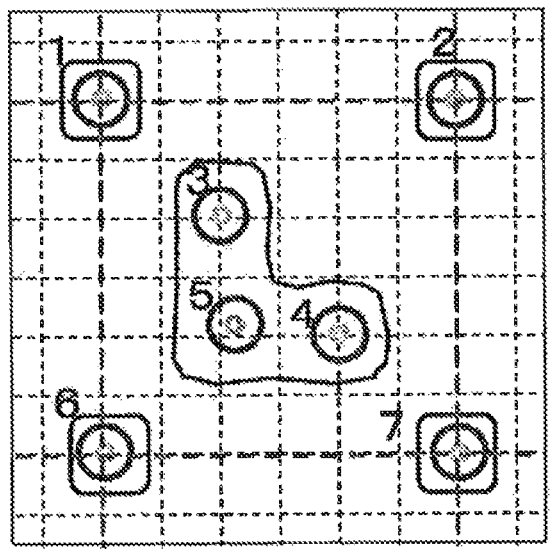
[Fig. 14]
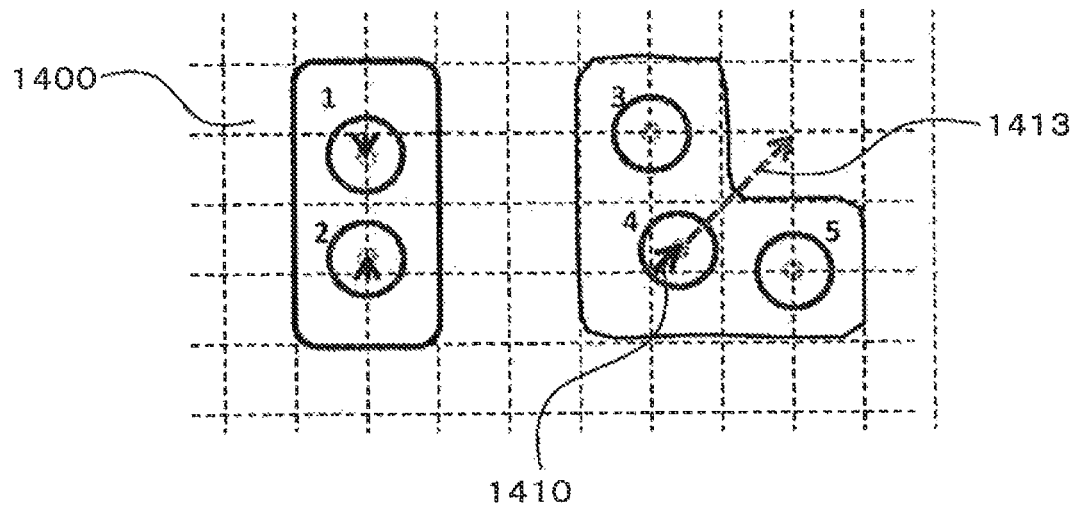

[Fig. 15]
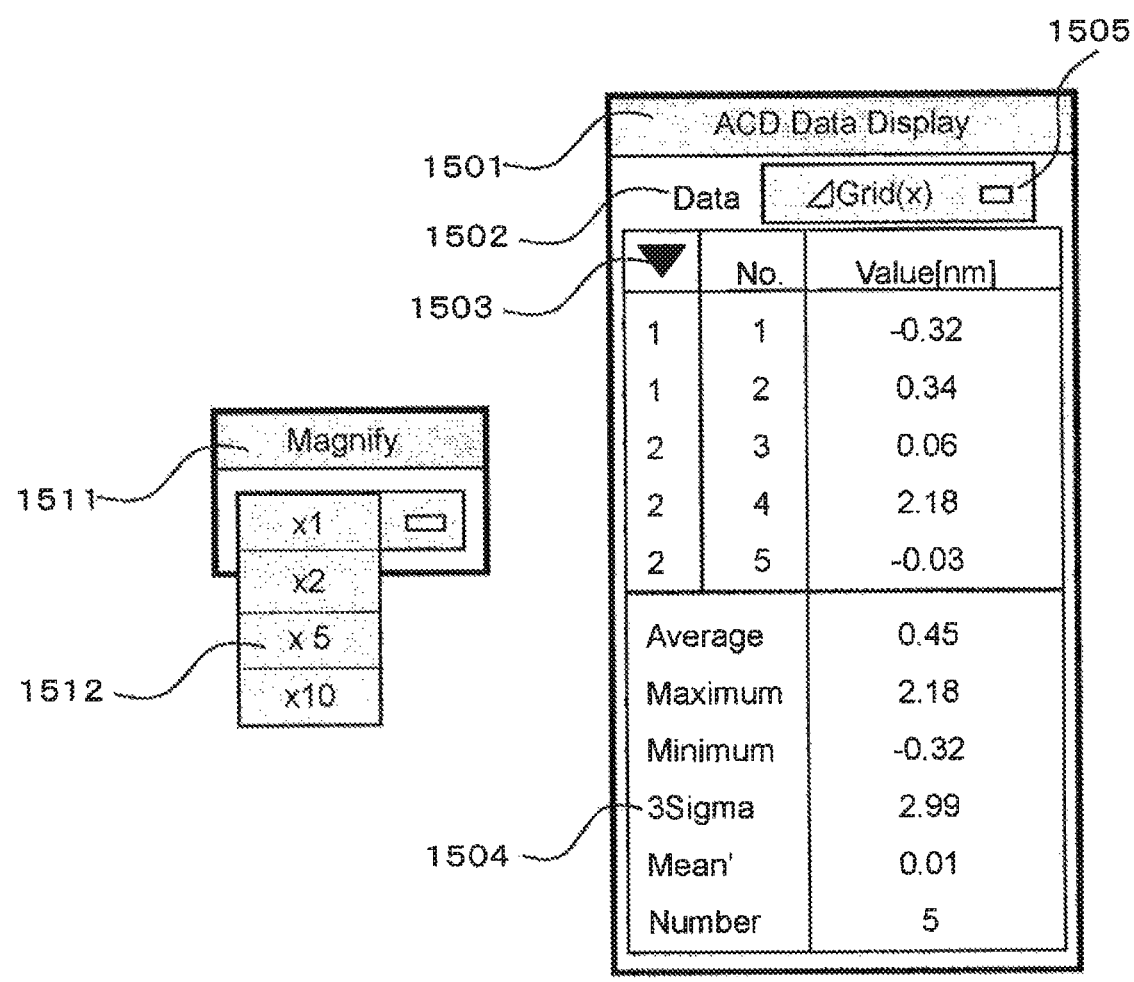

[Fig. 16]
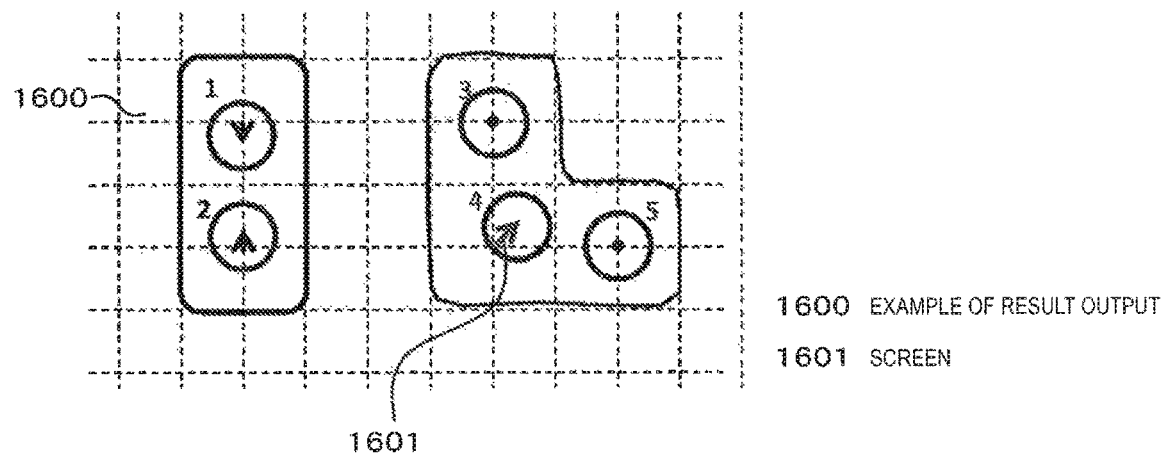
1600 EXAMPLE OF RESULT OUTPUT
1601 SCREEN
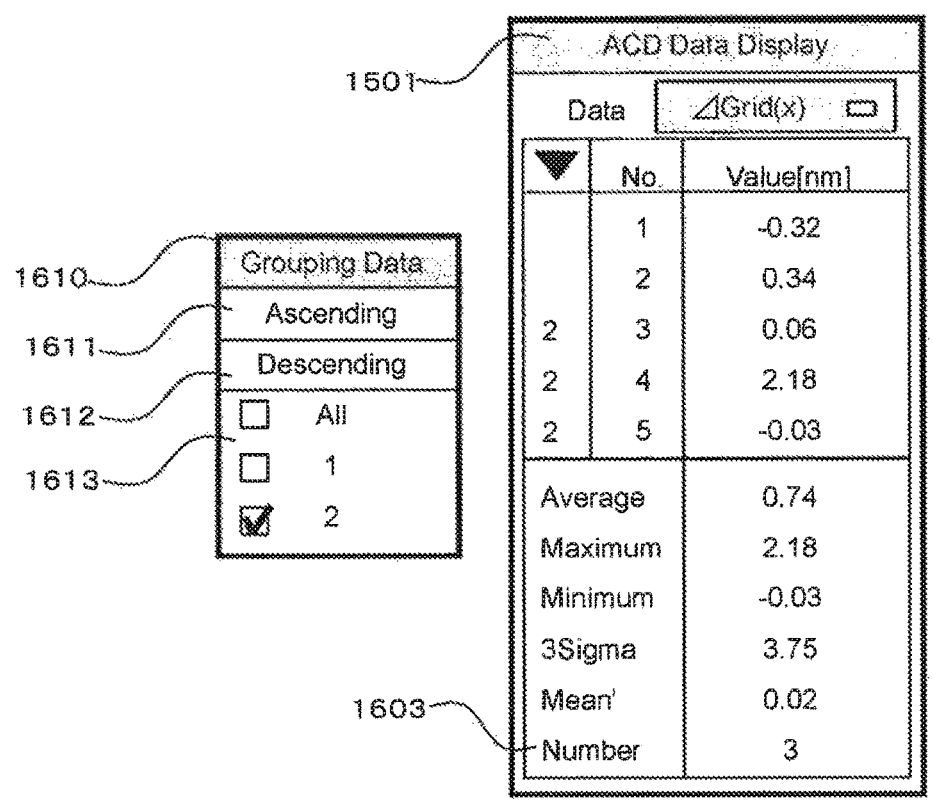

[Fig. 17]

| Gno. | Data No. | ⊿Grid(X) x[nm] | ⊿Grid(Y) y[nm] | ⊿Grid(R) r[nm] | ⊿Grid(θ) θ[rad] |
|---|---|---|---|---|---|
| 1 | 1 | -0.32 | -3.27 | 3.29 | 1.47 |
| 1 | 2 | 0.34 | 3.34 | 3.36 | 1.47 |
| 2 | 3 | 0.06 | -0.05 | 0.08 | -0.69 |
| 2 | 4 | 2.18 | 3.61 | 4.22 | 1.03 |
| 2 | 5 | -0.03 | 0.10 | 0.10 | -1.28 |
| | Average | 0.45 | 0.75 | 2.21 | 0.40 |
| | Maximum | 2.18 | 3.61 | 4.22 | 1.47 |
| | Minimum | -0.32 | -3.27 | 0.08 | -1.28 |
| | 3Sigma | 2.99 | 8.50 | 5.90 | 3.88 |
| | Mean' | 0.01 | 0.03 | 1.71 | 0.24 |
| | Number | 5 | 5 | 5 | 5 |

[Fig. 18]
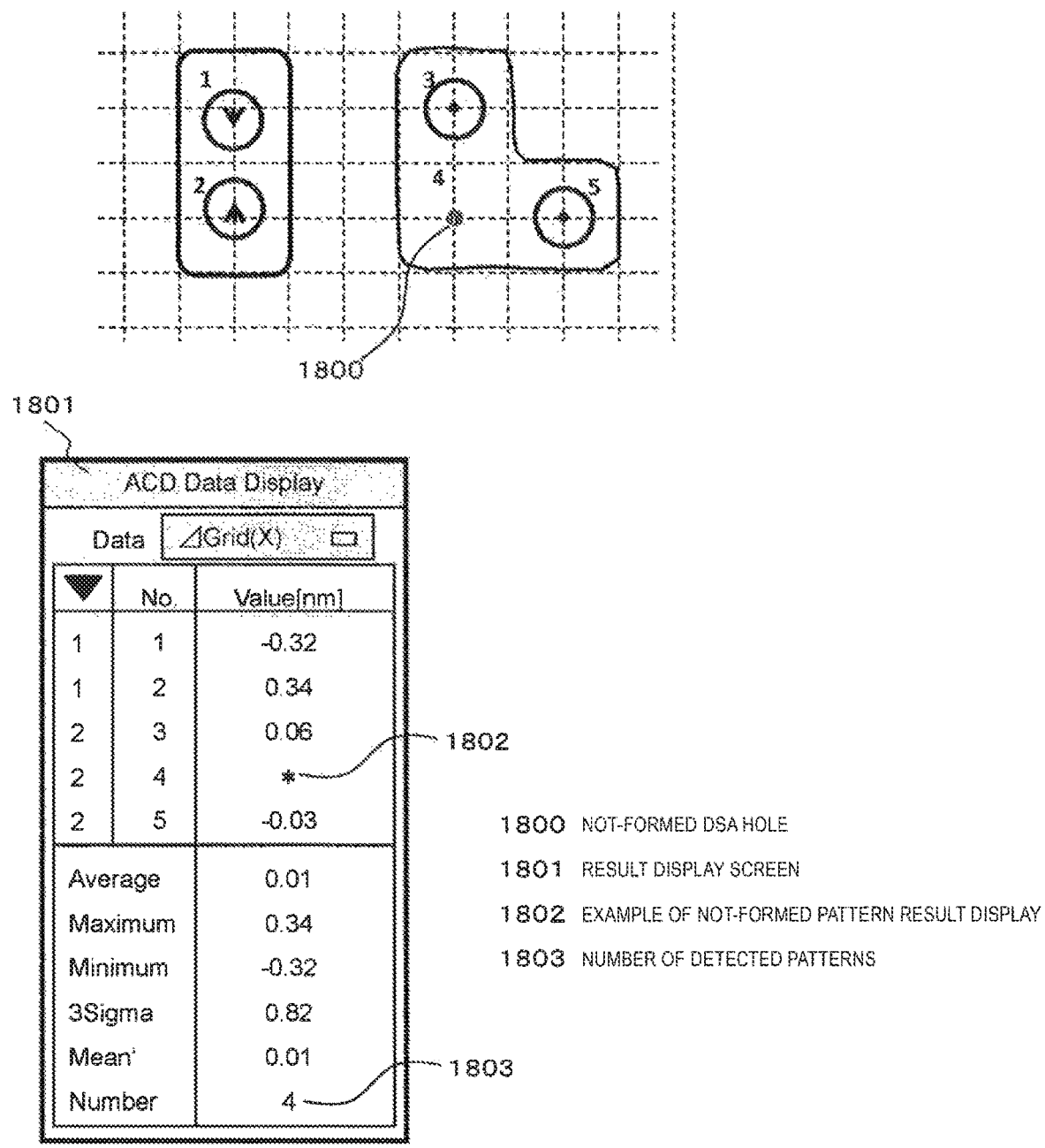
1800 NOT-FORMED DSA HOLE
1801 RESULT DISPLAY SCREEN
1802 EXAMPLE OF NOT-FORMED PATTERN RESULT DISPLAY
1803 NUMBER OF DETECTED PATTERNS

[Fig. 19]
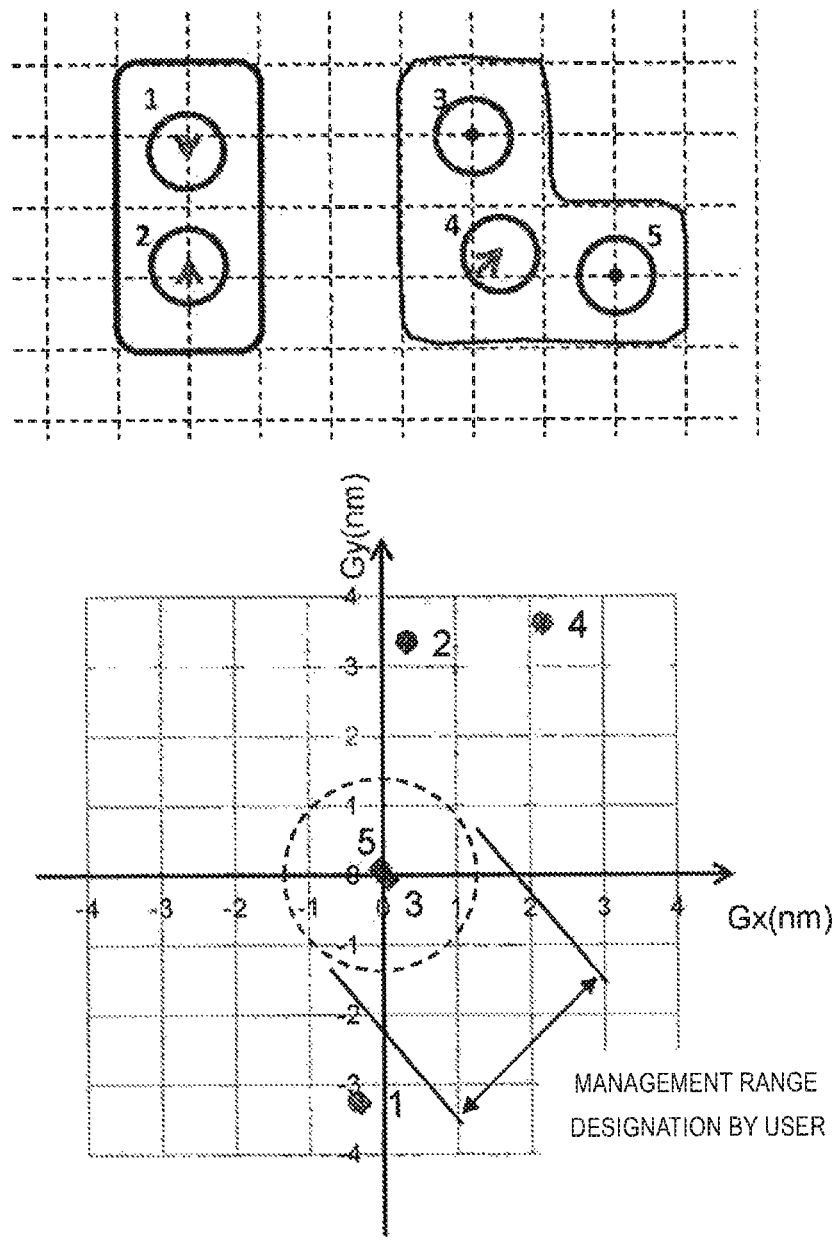

[Fig. 20]
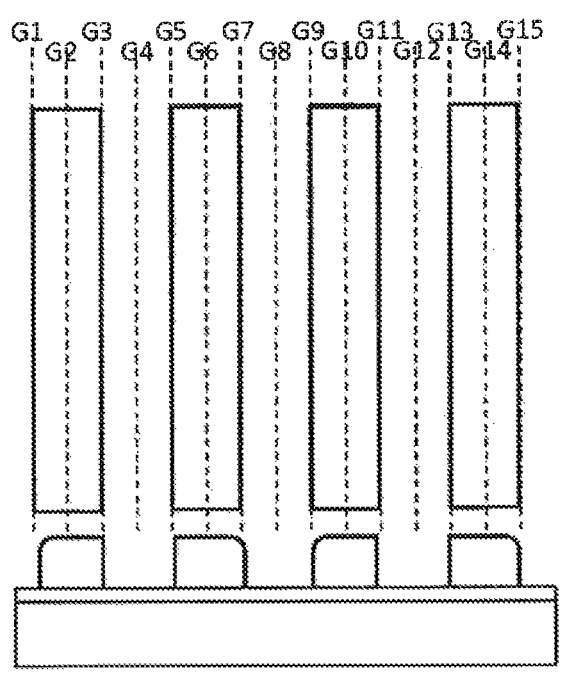
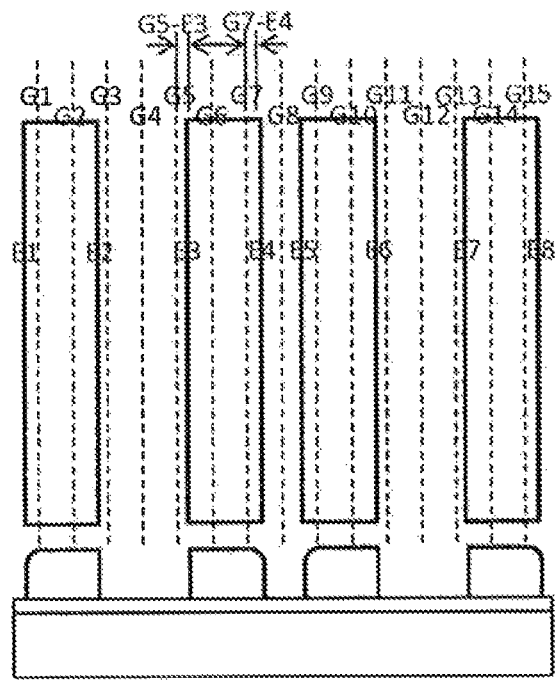
NORMAL PATTERN                    ABNORMAL PATTERN
IN CASE OF SADP, REFERENCE Grid IS ASSIGNED TO CENTROID OF Space, AND A POSITION CORRESPONDING TO THE HALF OF THE ASSIGNED GRID IS SET AS EDGE POSITION.

[Fig. 21]
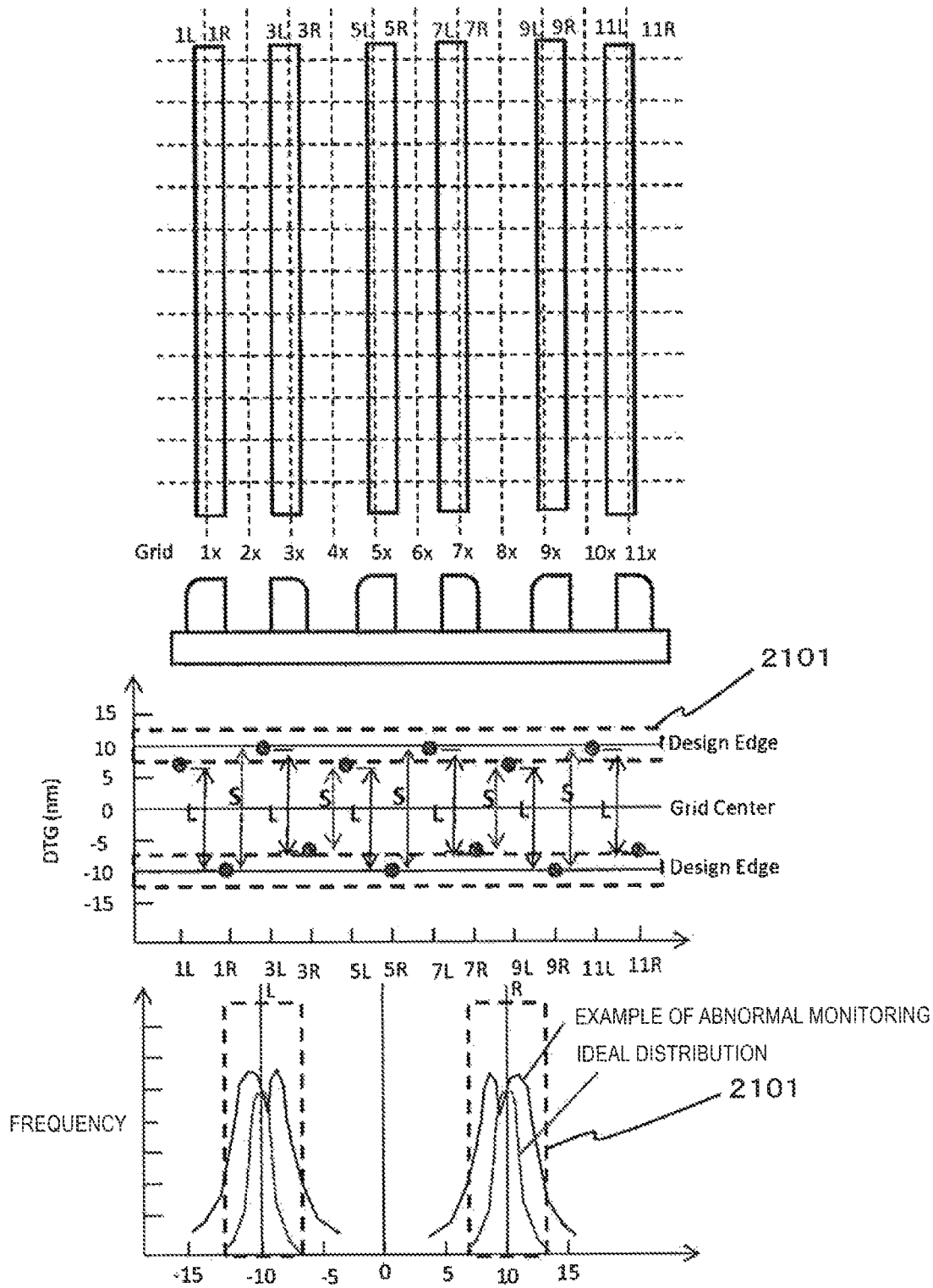

[Fig. 22]
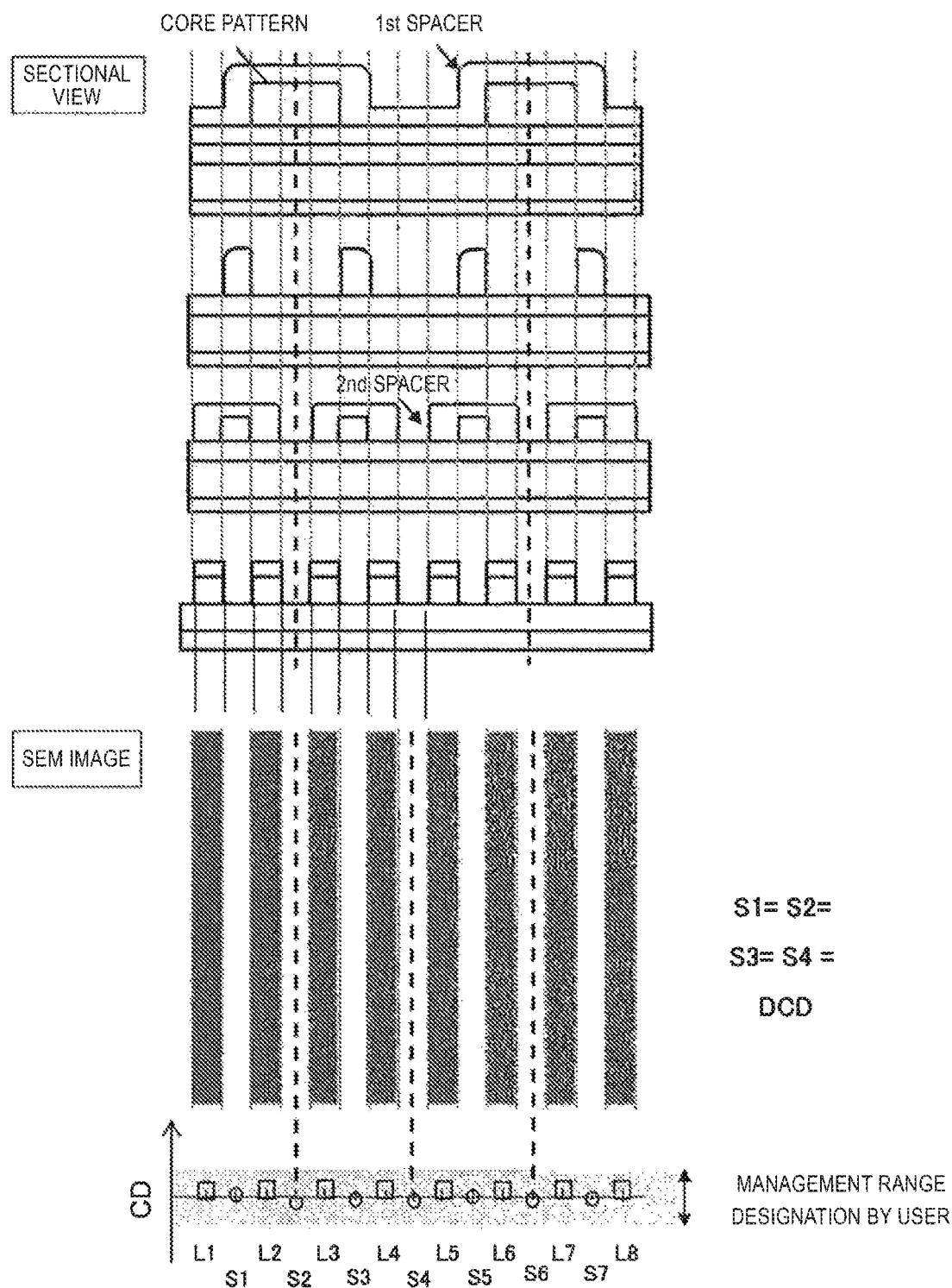

[Fig. 23]
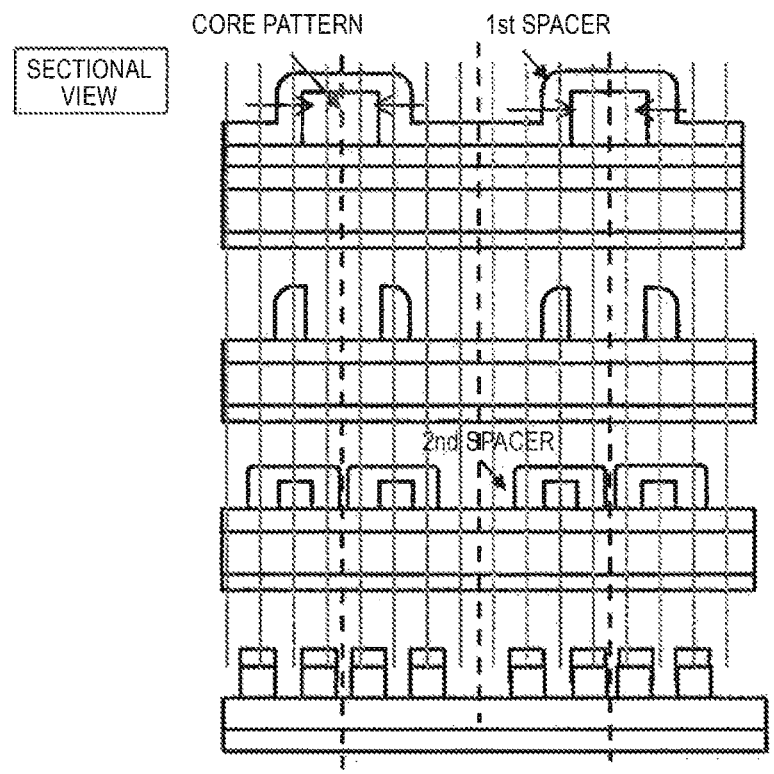
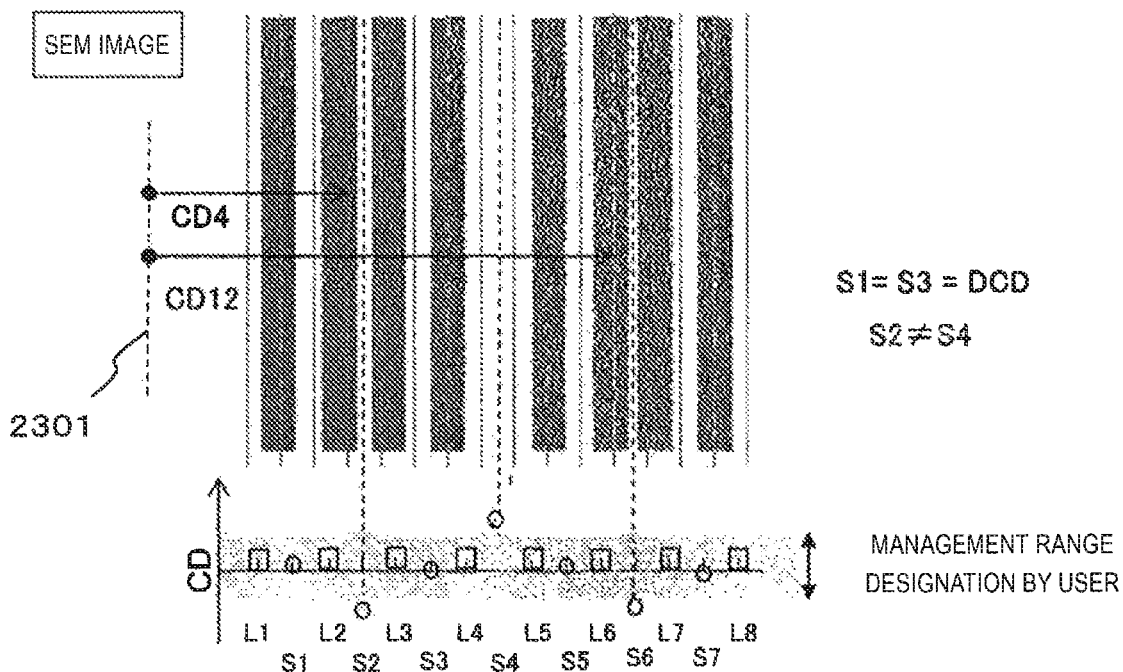

[Fig. 24]
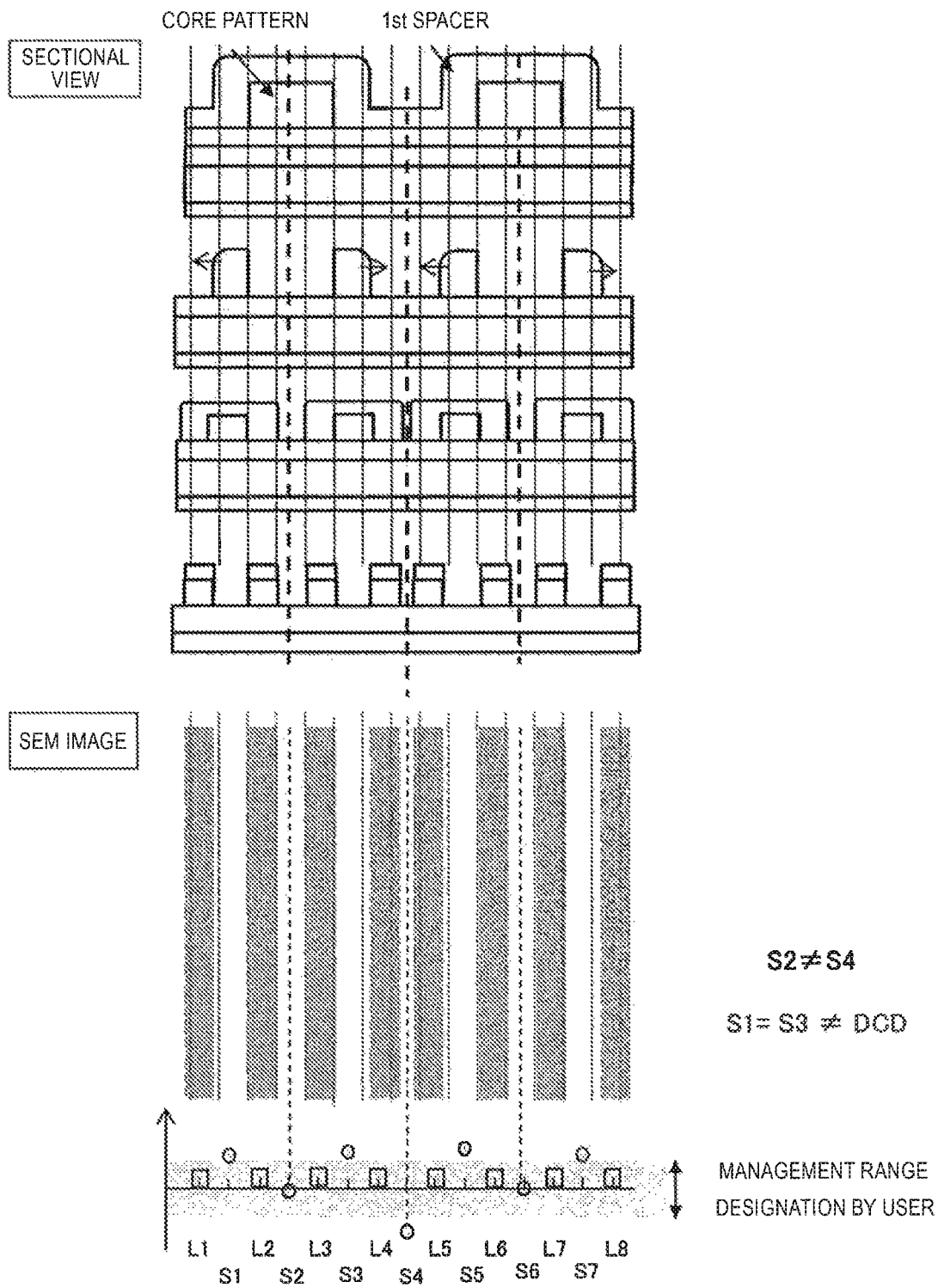

[Fig. 25]
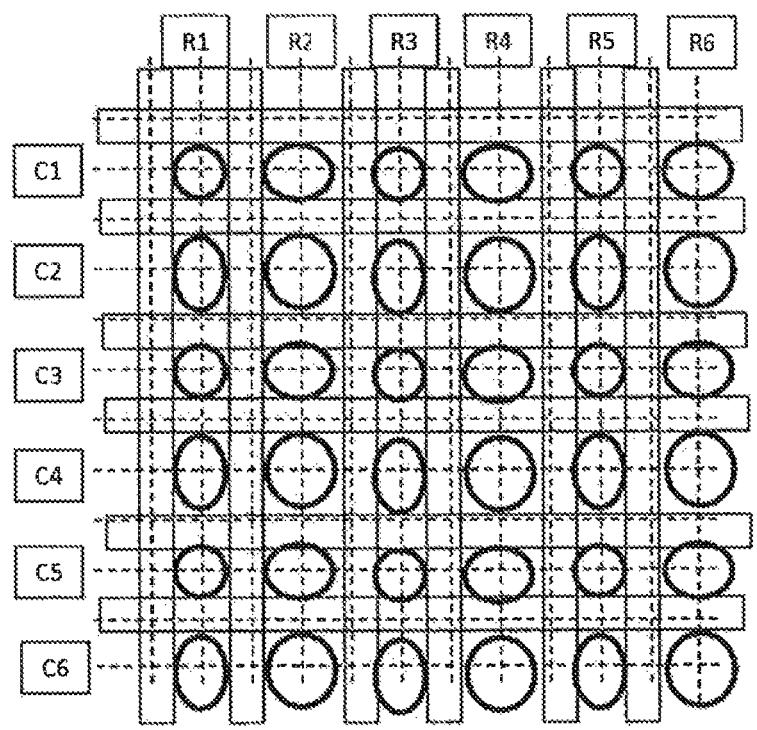

[Fig. 26]
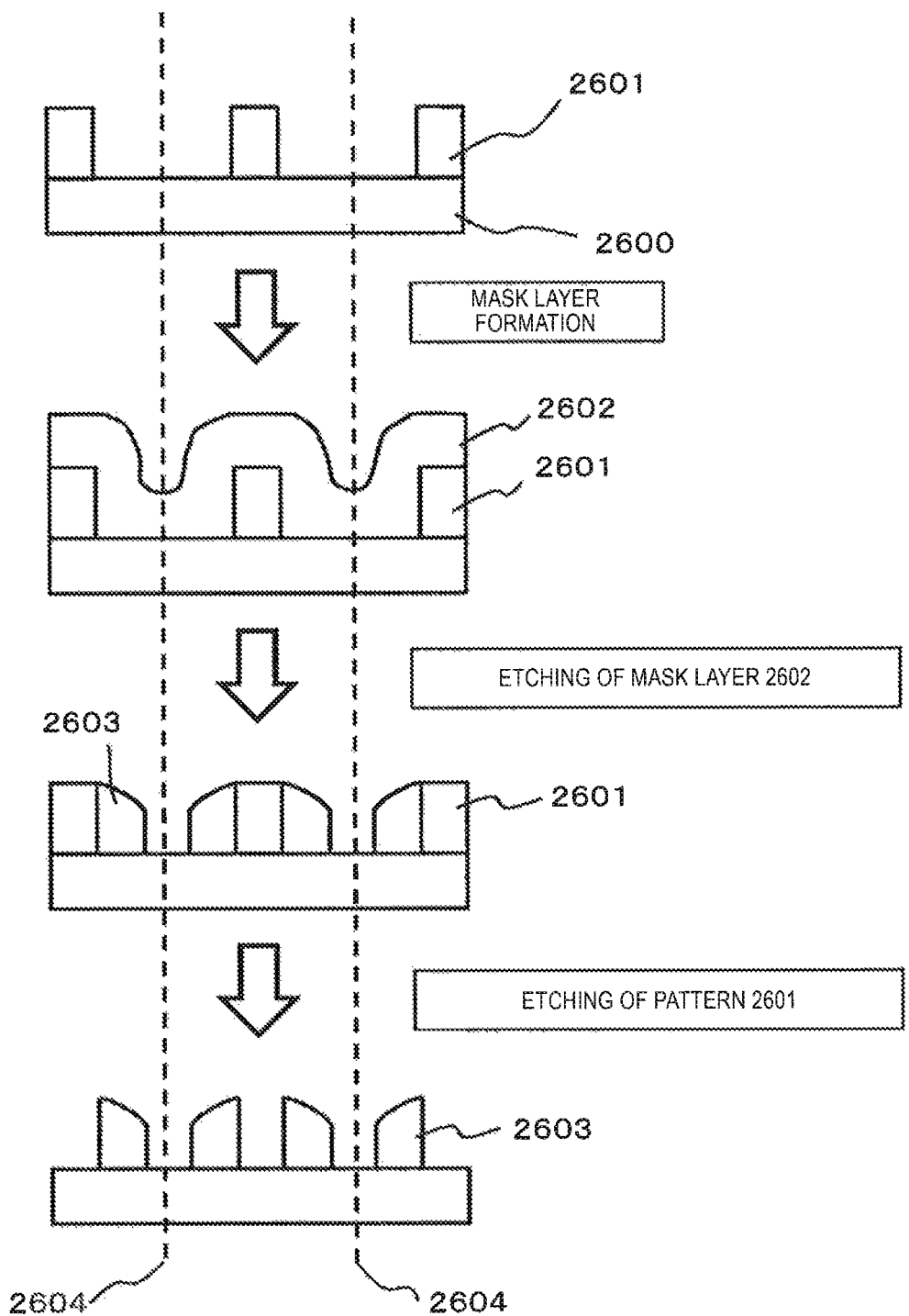

CORE: -4 nm

CORE: -4 nm
1st SPACER: +1 nm

CORE: -4 nm
1st SPACER: +1 nm
2nd SPACER: +1 nm

1st SPACER: -2 nm

[Fig. 28]

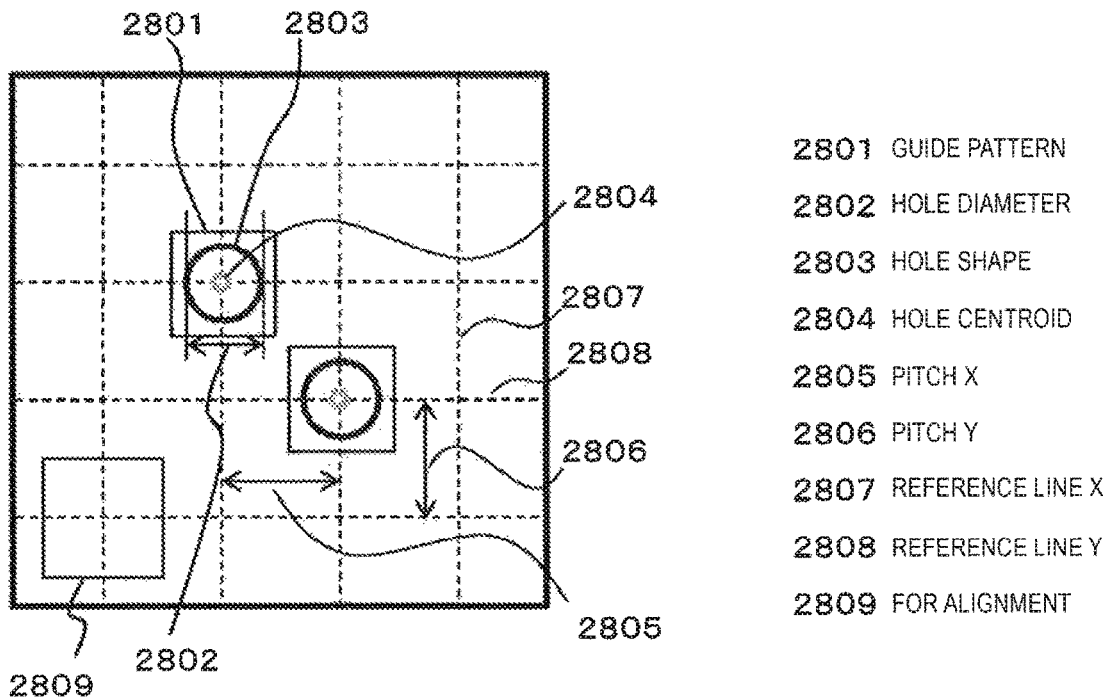

2801 GUIDE PATTERN
2802 HOLE DIAMETER
2803 HOLE SHAPE
2804 HOLE CENTROID
2805 PITCH X
2806 PITCH Y
2807 REFERENCE LINE X
2808 REFERENCE LINE Y
2809 FOR ALIGNMENT

[Fig. 29]

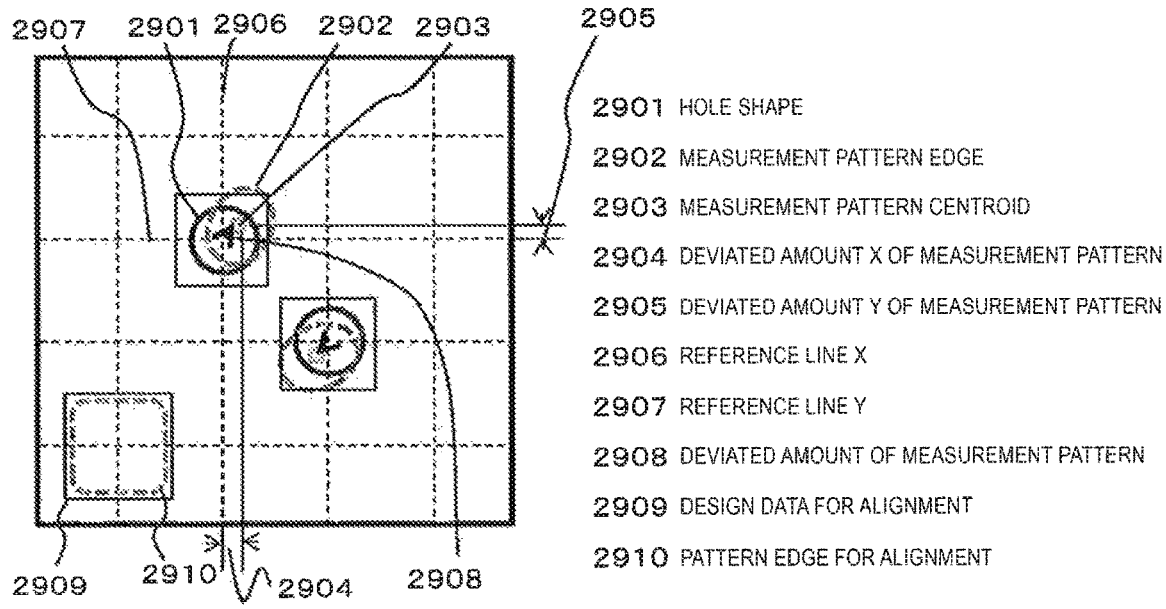

2901 HOLE SHAPE
2902 MEASUREMENT PATTERN EDGE
2903 MEASUREMENT PATTERN CENTROID
2904 DEVIATED AMOUNT X OF MEASUREMENT PATTERN
2905 DEVIATED AMOUNT Y OF MEASUREMENT PATTERN
2906 REFERENCE LINE X
2907 REFERENCE LINE Y
2908 DEVIATED AMOUNT OF MEASUREMENT PATTERN
2909 DESIGN DATA FOR ALIGNMENT
2910 PATTERN EDGE FOR ALIGNMENT

[Fig. 30]
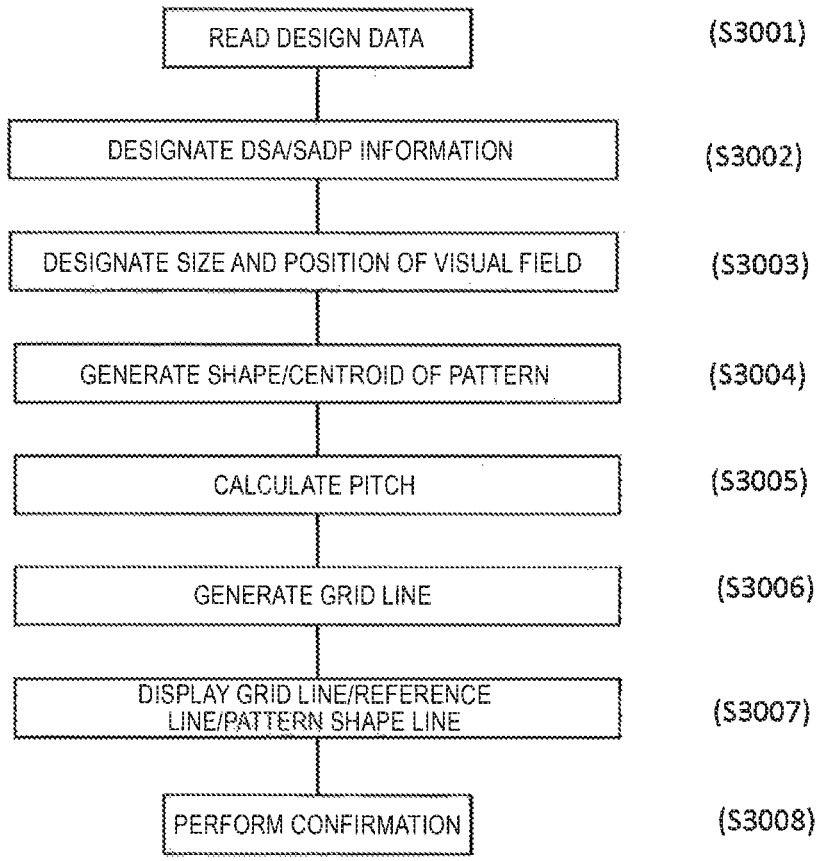
[Fig. 31]
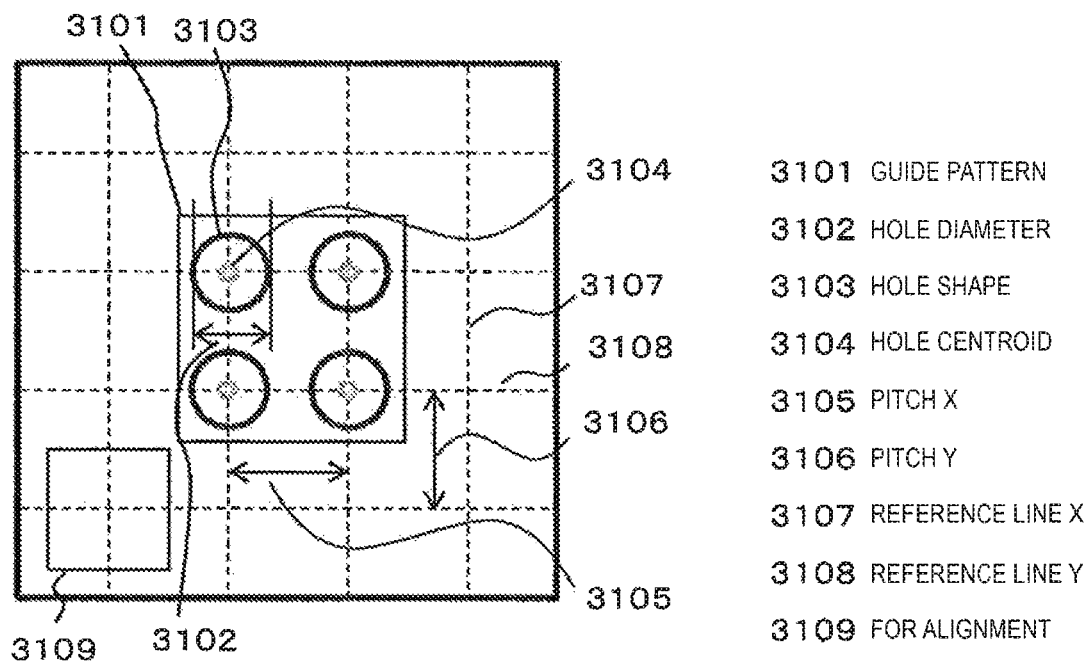
3101 GUIDE PATTERN
3102 HOLE DIAMETER
3103 HOLE SHAPE
3104 HOLE CENTROID
3105 PITCH X
3106 PITCH Y
3107 REFERENCE LINE X
3108 REFERENCE LINE Y
3109 FOR ALIGNMENT

[Fig. 32]

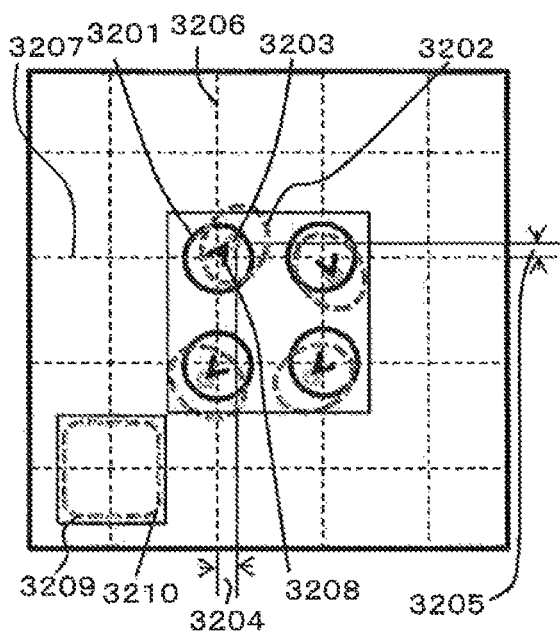

3201 HOLE SHAPE
3202 MEASUREMENT PATTERN EDGE
3203 MEASUREMENT PATTERN CENTROID
3204 DEVIATED AMOUNT X OF MEASUREMENT PATTERN
3205 DEVIATED AMOUNT Y OF MEASUREMENT PATTERN
3206 REFERENCE LINE X
3207 REFERENCE LINE Y
3208 DEVIATED AMOUNT OF MEASUREMENT PATTERN
3209 DESIGN DATA FOR ALIGNMENT
3210 PATTERN EDGE FOR ALIGNMENT

[Fig. 33]

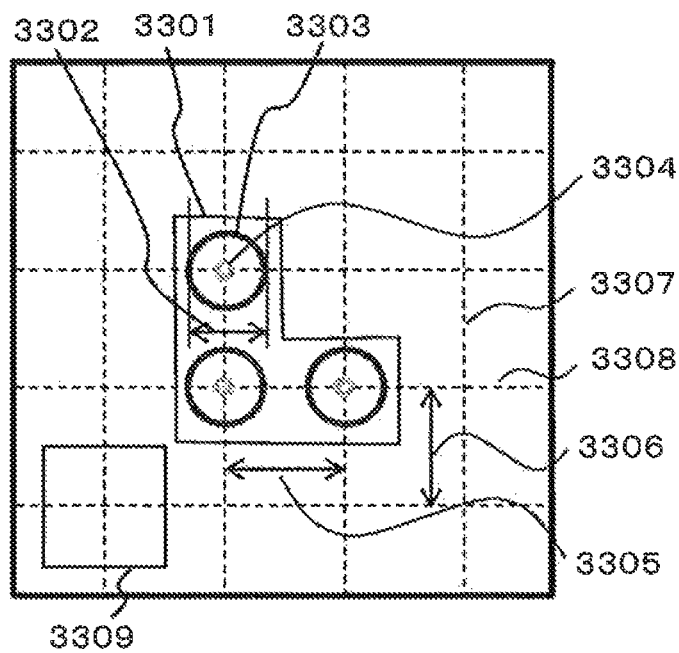

3301 GUIDE PATTERN
3302 HOLE DIAMETER
3303 HOLE SHAPE
3304 HOLE CENTROID
3305 PITCH X
3306 PITCH Y
3307 REFERENCE LINE X
3308 REFERENCE LINE Y
3309 FOR ALIGNMENT

[Fig. 34]

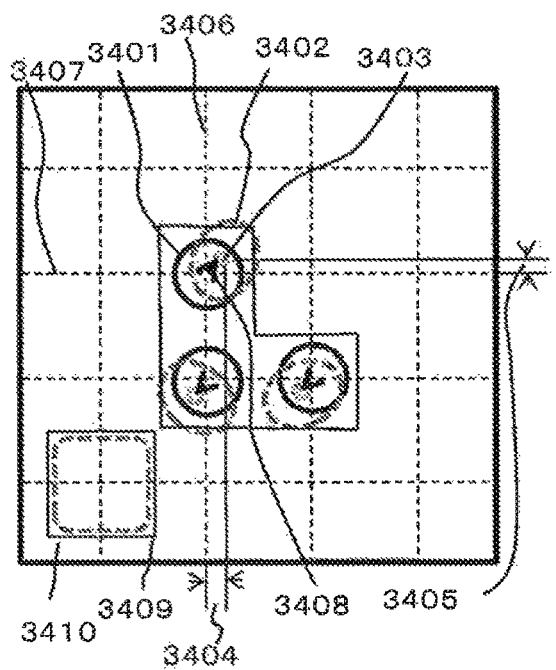

3401 HOLE SHAPE
3402 MEASUREMENT PATTERN EDGE
3403 MEASUREMENT PATTERN CENTROID
3404 DEVIATED AMOUNT X OF MEASUREMENT PATTERN
3405 DEVIATED AMOUNT Y OF MEASUREMENT PATTERN
3406 REFERENCE LINE X
3407 REFERENCE LINE Y
3408 DEVIATED AMOUNT OF MEASUREMENT PATTERN
3409 DESIGN DATA FOR ALIGNMENT
3410 PATTERN EDGE FOR ALIGNMENT

[Fig. 35]

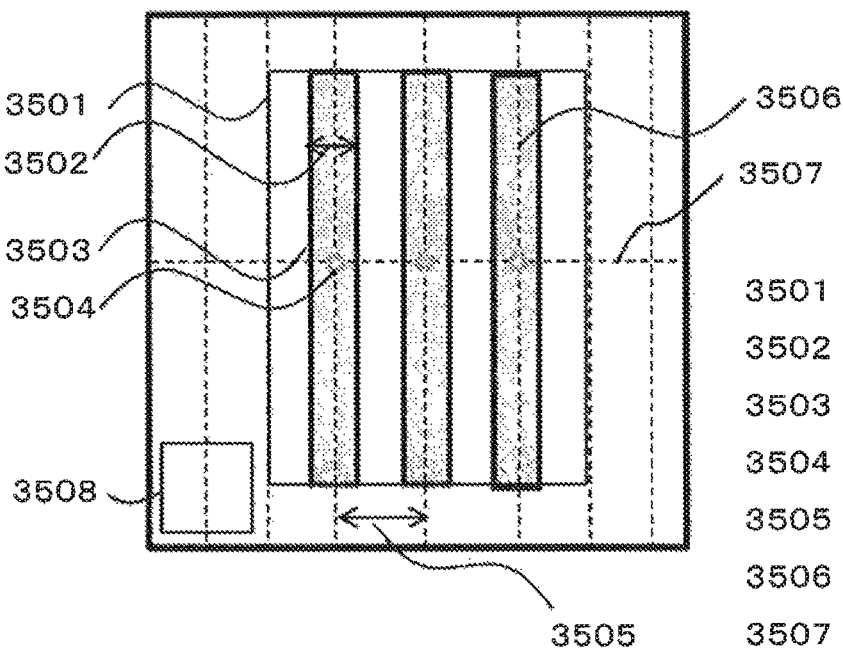

3501 GUIDE PATTERN
3502 LINE WIDTH
3503 LINE SHAPE
3504 LINE CENTROID
3505 PITCH X
3506 REFERENCE LINE X
3507 REFERENCE LINE Y
3508 FOR ALIGNMENT

[Fig. 36]
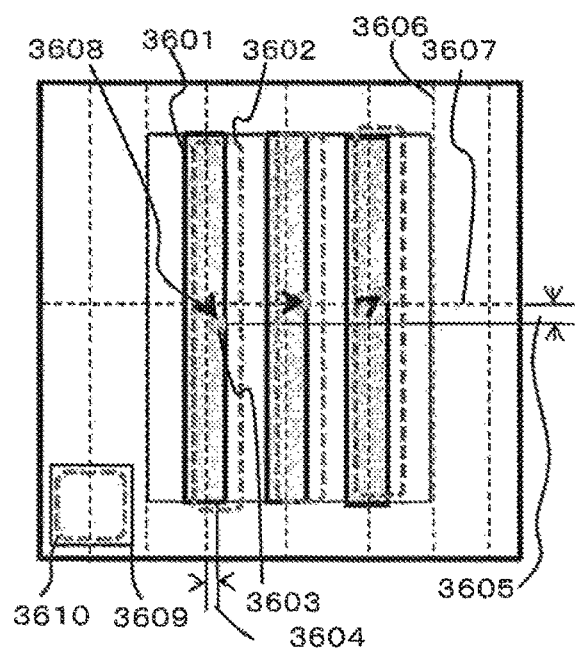
3601 LINE SHAPE
3602 MEASUREMENT PATTERN EDGE
3603 MEASUREMENT PATTERN CENTROID
3604 DEVIATED AMOUNT X OF MEASUREMENT PATTERN
3605 DEVIATED AMOUNT Y OF MEASUREMENT PATTERN
3606 REFERENCE LINE X
3607 REFERENCE LINE Y
3608 DEVIATED AMOUNT OF MEASUREMENT PATTERN
3609 DESIGN DATA FOR ALIGNMENT
3610 PATTERN EDGE FOR ALIGNMENT

[Fig. 37]
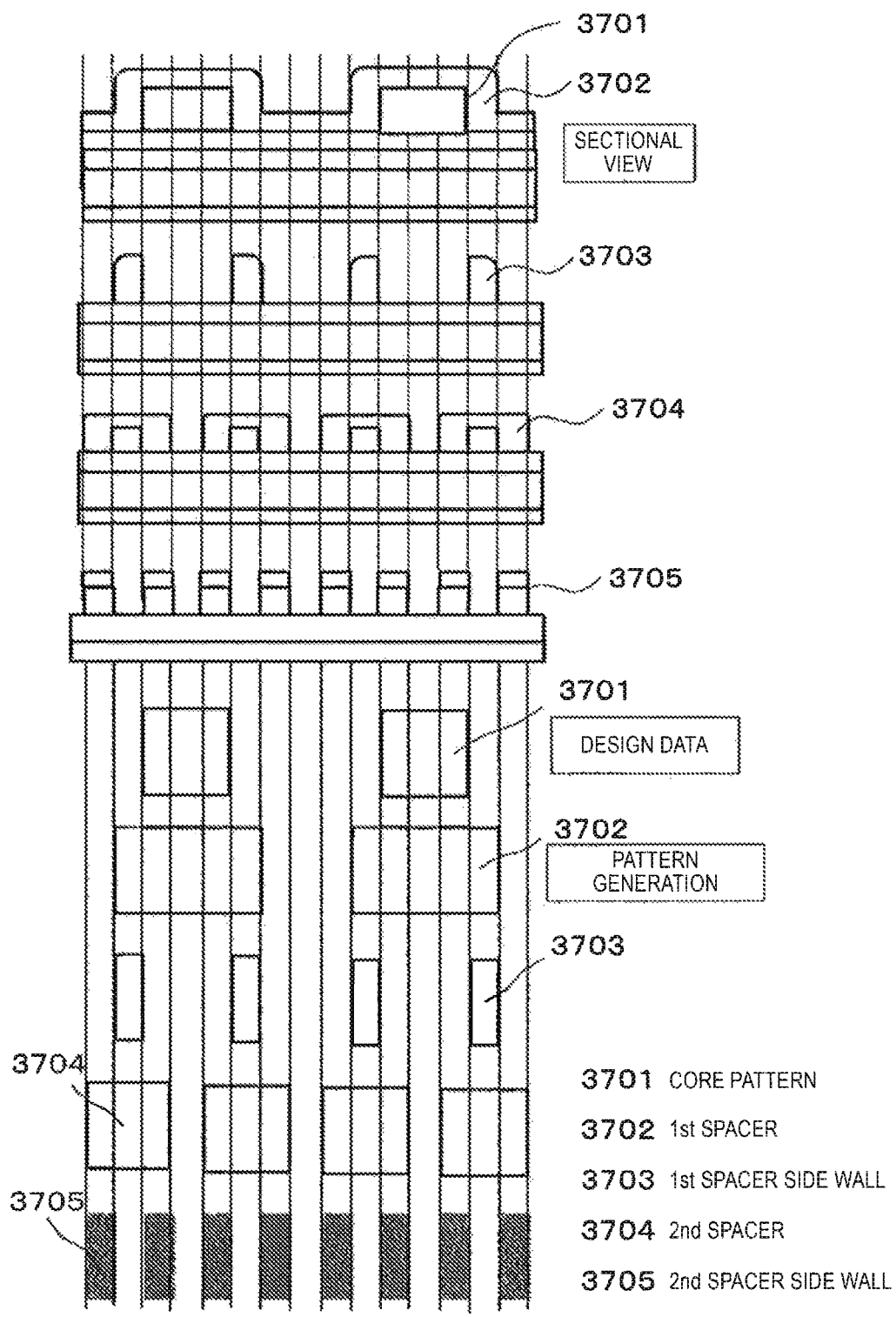

[Fig. 38]
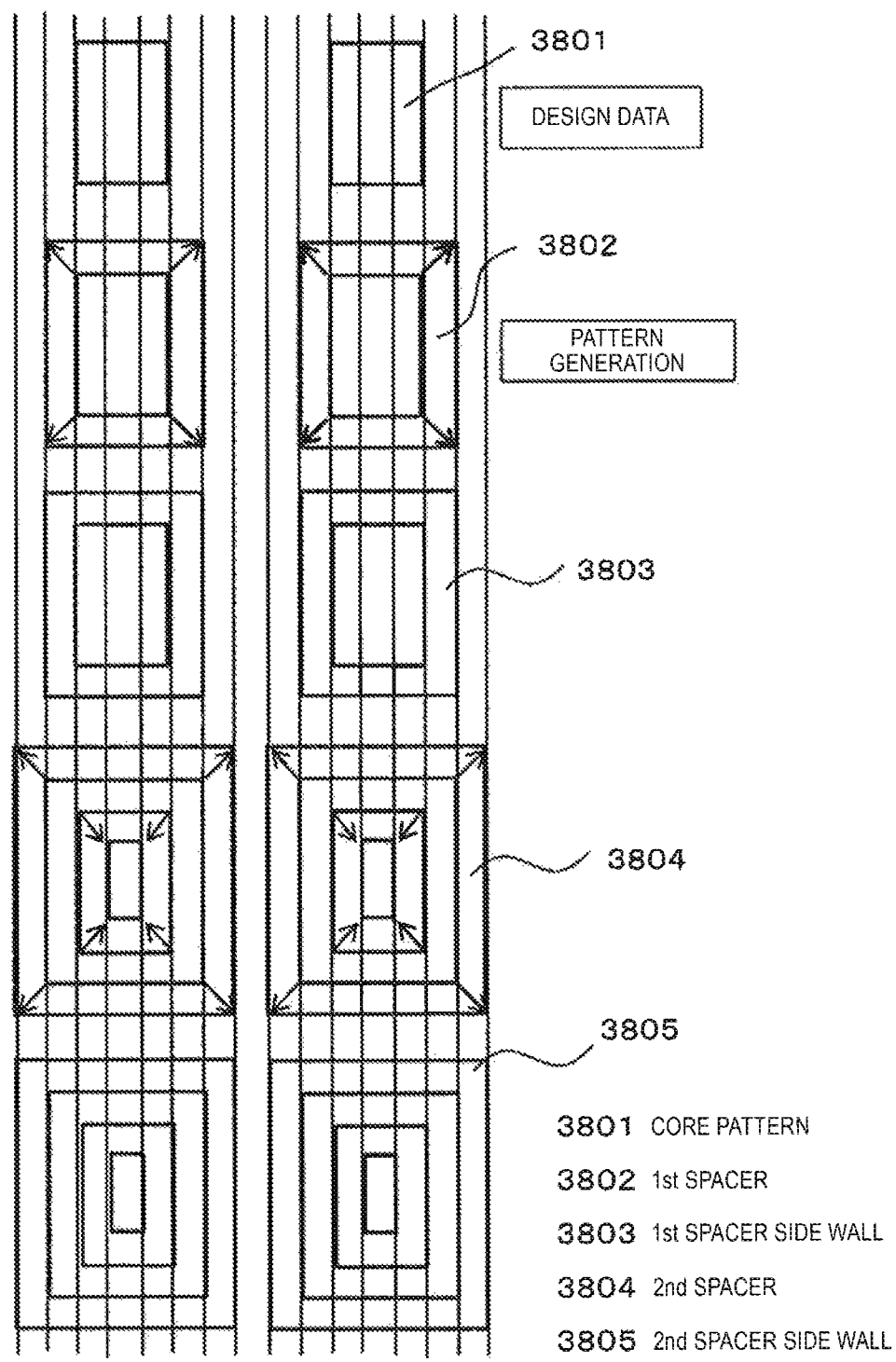
3801 CORE PATTERN
3802 1st SPACER
3803 1st SPACER SIDE WALL
3804 2nd SPACER
3805 2nd SPACER SIDE WALL

[Fig. 39]
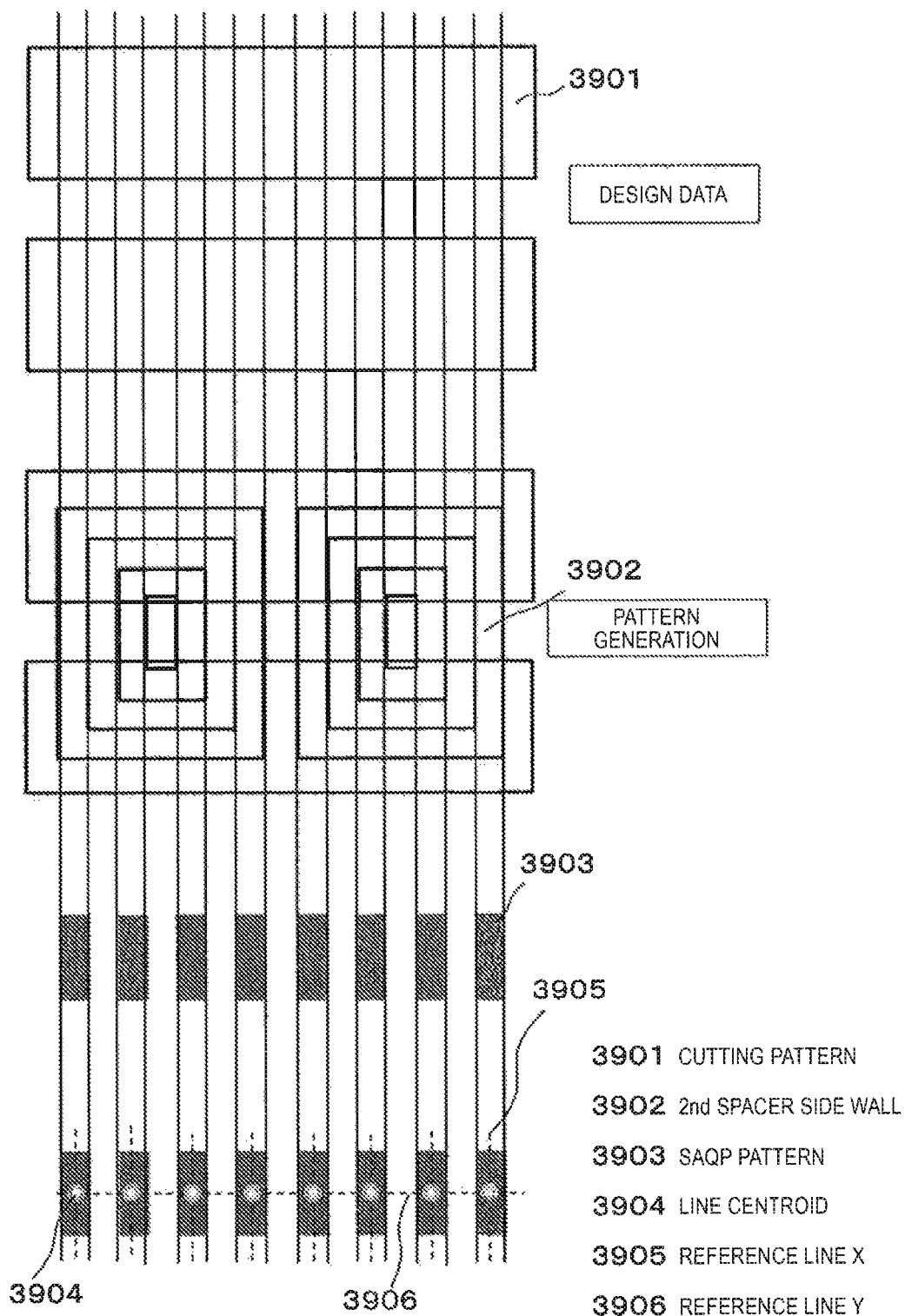
3901 CUTTING PATTERN
3902 2nd SPACER SIDE WALL
3903 SAQP PATTERN
3904 LINE CENTROID
3905 REFERENCE LINE X
3906 REFERENCE LINE Y

[Fig. 40]
4000 Dense Hole Pattern
4001 Pattern Gravity
4002 Grid
4003 Defect Hole Pattern
4011 Pattern Edge Gravity
4012 Diameter
4013 Pitch
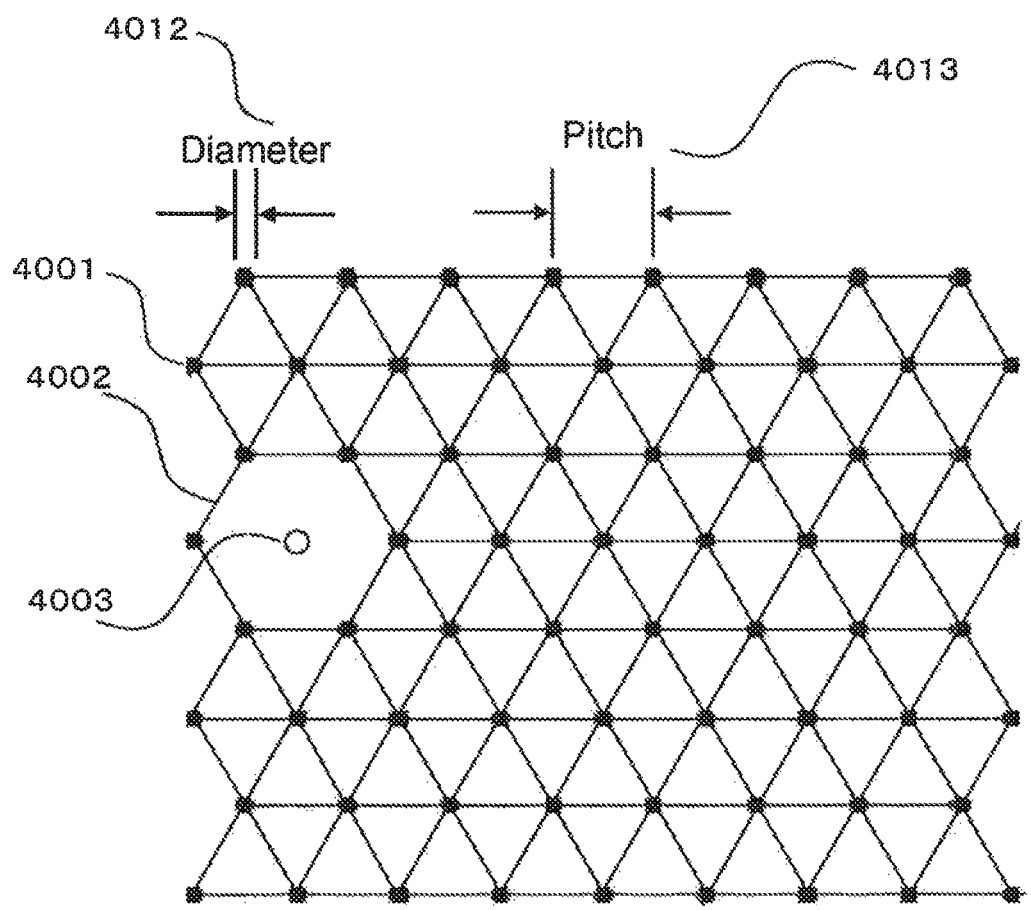

[Fig. 41]
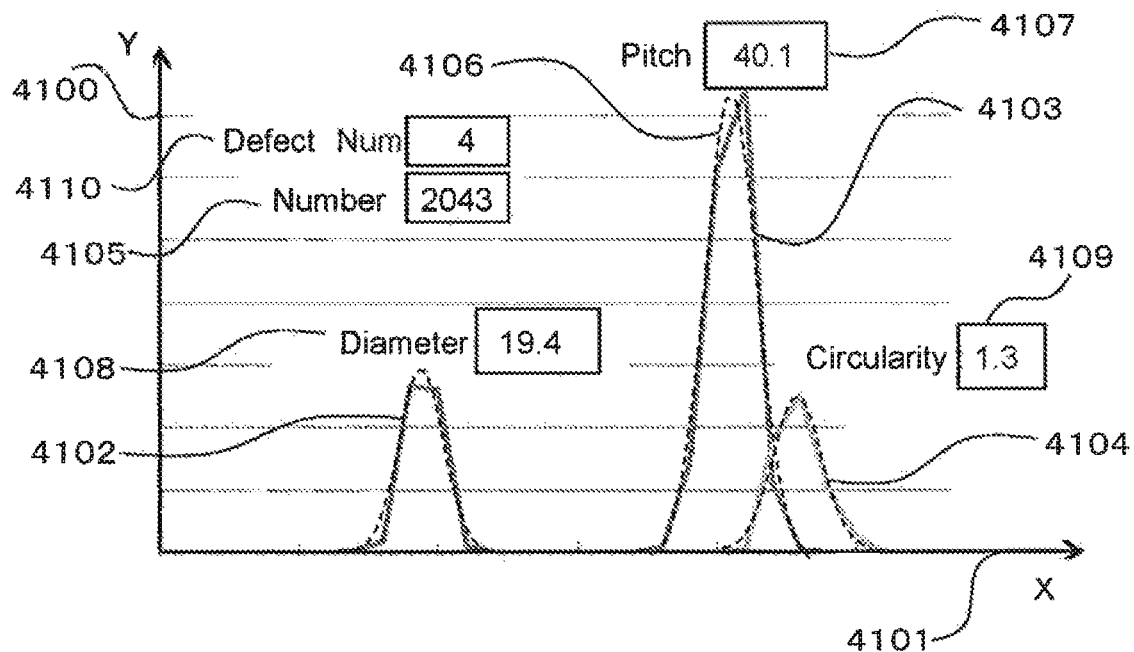
4100 Histogram
4101 Size(nm)/Ratio
4102 Histogram of Diameters
4103 Histogram of Pitches
4104 Histogram of Circularities
4105 Number of Patterns
4106 Fitting Curve
4107 Average of Pitch
4108 Average of Diameter
4109 Average of Circularity
4110 Defect Number

[Fig. 42]
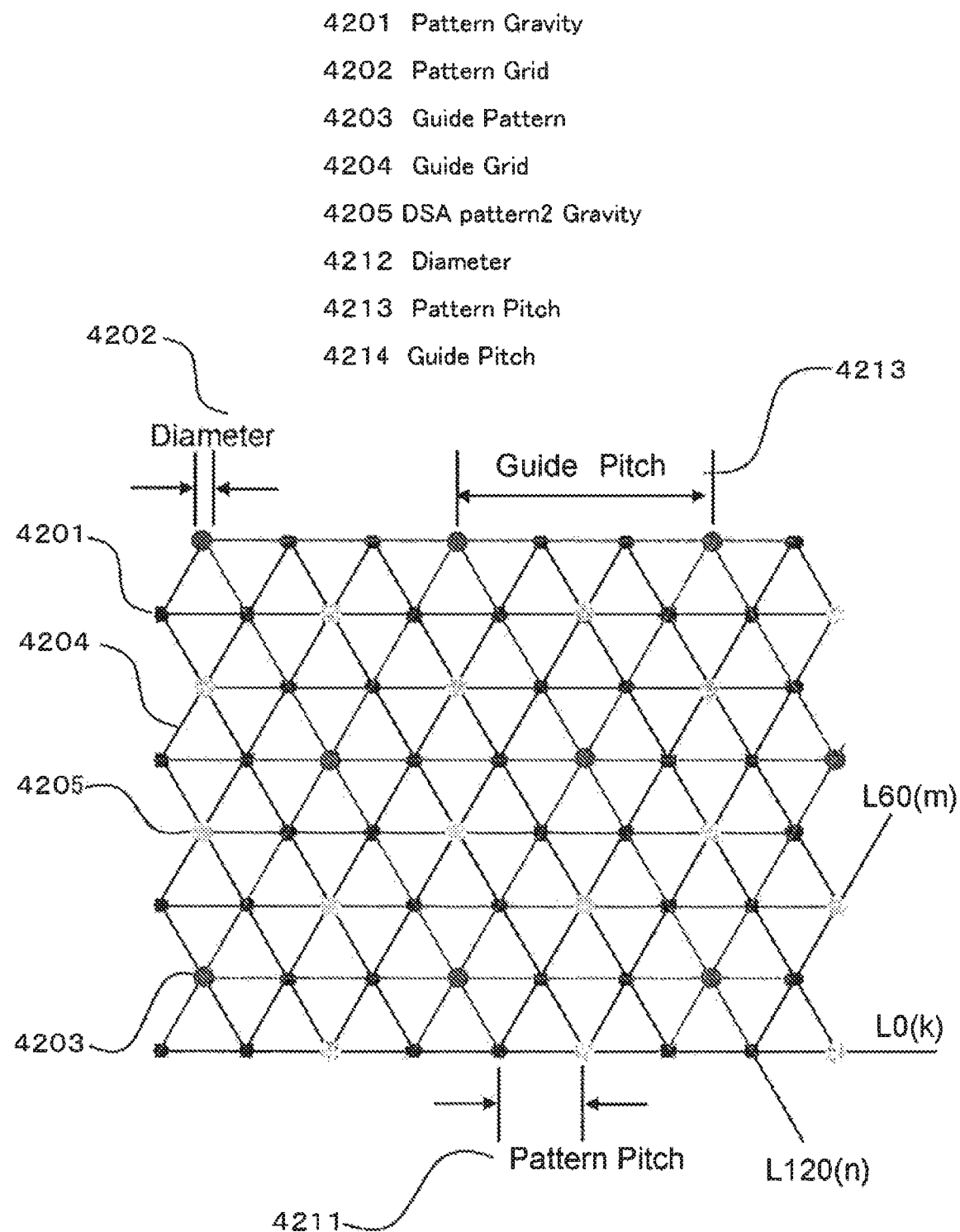

[Fig. 43]
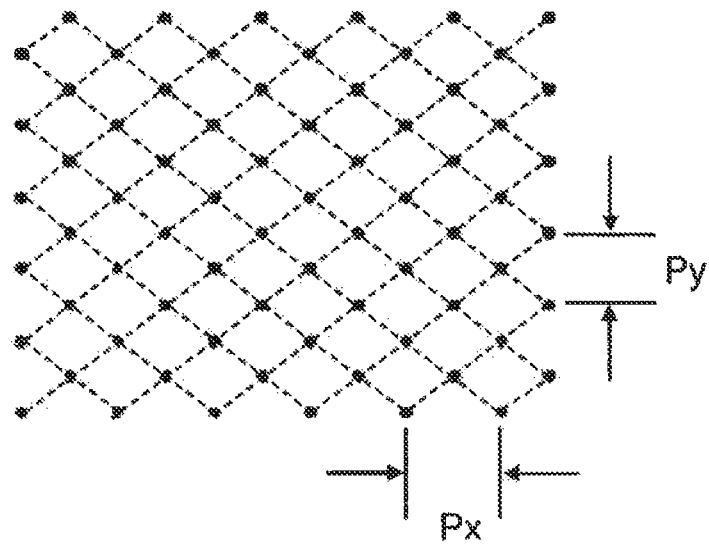
[Fig. 44]
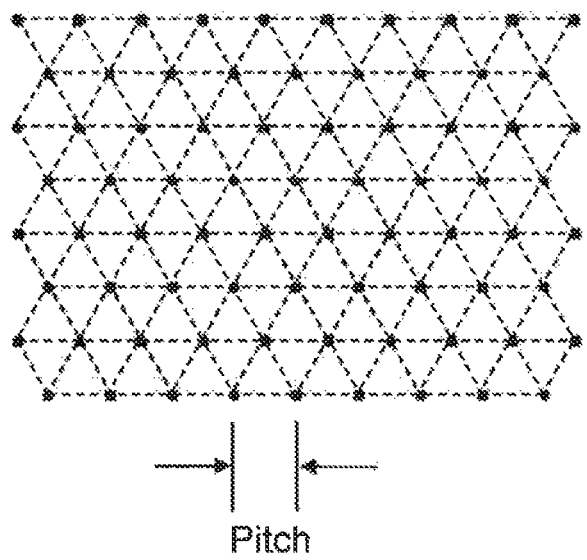

[Fig. 45]
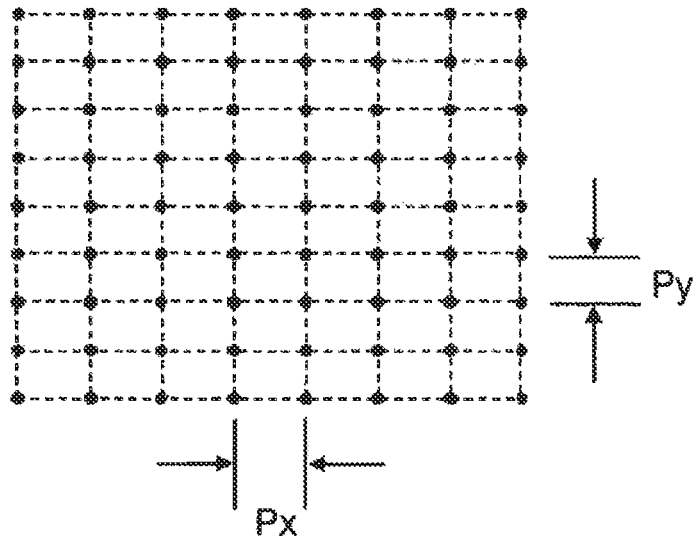
[Fig. 46]
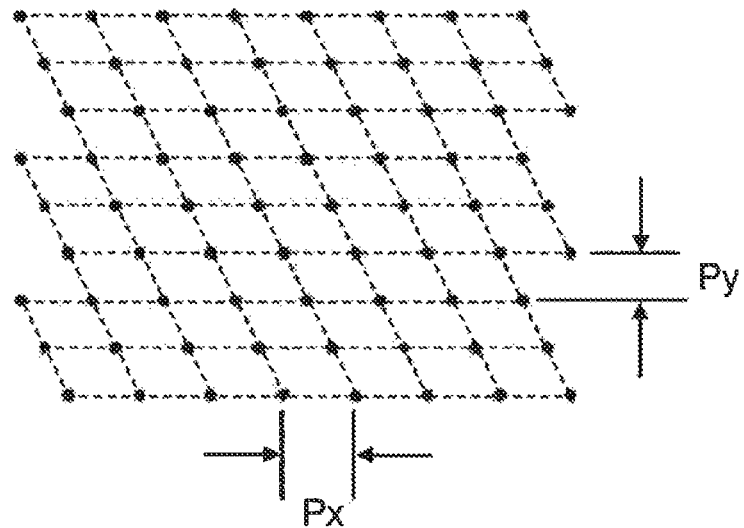

[Fig. 47]
| SELECTION | Px | Py |
|---|---|---|
| ORTHORHOMBIC LATTICE | 40 | 30 |
| HEXAGONAL LATTICE | 40 | – |
| RECTANGULAR LATTICE | 40 | 30 |
| PARALLELOGRAM LATTICE | 40 | 20 |
[Fig. 48]
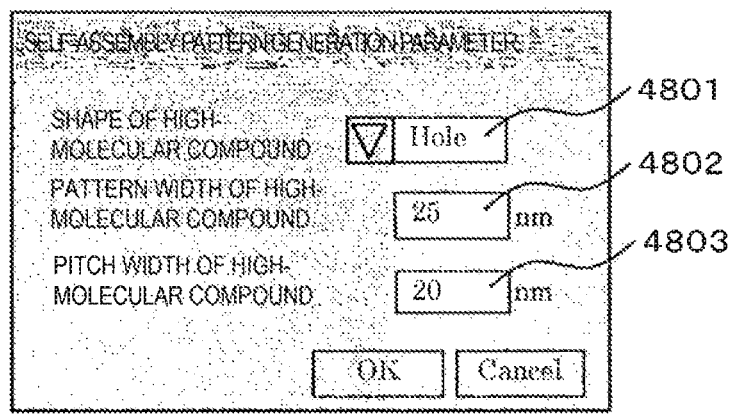
4801 SHAPE SELECTION
4802 PATTERN WIDTH INPUT
4803 PITCH WIDTH INPUT
[Fig. 49]
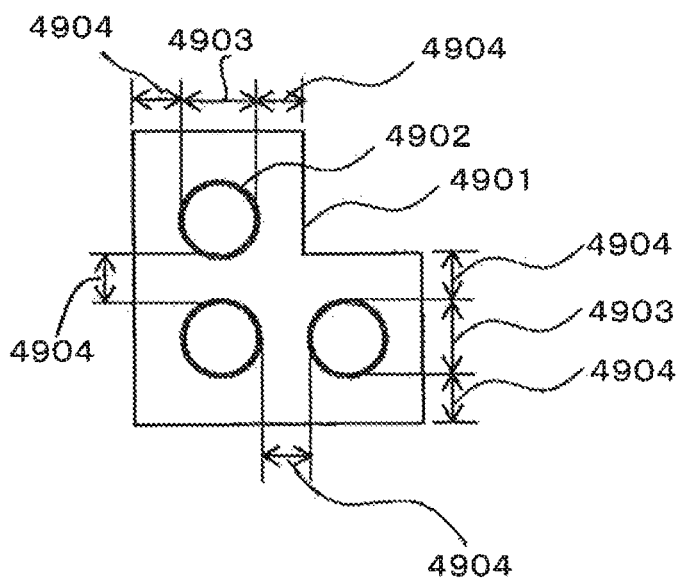
4901 GUIDE PATTERN
4902 PATTERN SHAPE
4903 PATTERN WIDTH
4904 PATTERN PITCH WIDTH

PATTERN MEASUREMENT DEVICE, AND COMPUTER PROGRAM FOR MEASURING PATTERN

TECHNICAL FIELD

The present invention relates to a pattern measurement device and a computer program for measuring a pattern, and particularly, to a pattern measurement device and a computer program for measuring patterns which are equally arranged on design data.

BACKGROUND ART

Large scaling and high integration of a semiconductor device are in progress. A micro-machining technology supports the progress. In the micro-machining technology, a lithography technology can be advanced by reducing a wavelength of a projection exposure device or by increasing NA of a projection lens. However, such a lithography technology has encountered limitations, and, in a method using ultraviolet light or far-ultraviolet light, a substantially 40 nm half pitch is a limit. As a method of surpassing the limit, a method using EUV light has been developed. However, the developed method has not been commercialized. Meanwhile, pattern forming methods of using various processing technologies, or new methods of using characteristics of the material have been developed.

As one method among the above-described methods, the Self aligned double patterning (SADP) method (NPL 1) of doubling a pattern by self-aligning or the Self aligned quadruple patterning (SAQP) method of quadrupling a pattern by the self-aligning is provided. In such a method, a material having high etching-resistance selectively remains on a side wall of a pattern formed by lithography, the pattern formed by the lithography is removed, and thereby the remaining side wall is used as a pattern. Accordingly, it is possible to double a pattern. If this step is repeated twice, it is also possible to quadruple a pattern. In other words, it is possible to reduce a pitch in a pattern to be ½ or ¼.

As a method of causing the number of patterns using characteristics of a material to be increased to be n times, a method of using a self-derivative assembly process, that is, Directed Self Assembly (DSA) (NPL 2) is provided. The method is a method of using the principle in which self-assembly is performed with a difference of thermodynamic characteristics between two types of polymers, by using a material in which the two types of polymers referred to as high-molecular block copolymer are synthesized to each other, so as to perform block binding. With this method, a plurality of patterns can be formed on the inner side of a pattern (guide pattern) formed by lithography, or fine holes can be formed on the inner side of a hole having a large size, by self-alignment.

PTL 1 discloses that a plurality of reference lines is superimposed on a contour line image obtained based on a scanning electron microscope image of a photomask, and measurement is performed by using the reference lines.

CITATION LIST

Patent Literature

PTL 1: JP-A-2011-137901 (corresponding U.S. Patent Publication US2012/0290990)

Non-Patent Literature

NPL 1: H. Yaegashi, et al., "Novel approaches to implement the self-aligned spacer DP process Towards 22-nm Nodes", Proc. Of SPIE, 832483241-M NPL 2: B. Rathsack, et al., "Pattern scaling with directed self assembly through lithography and etch process integration", Proc. Of SPIE, 83230B-1 (2012)

SUMMARY OF INVENTION

Technical Problem

According to the patterning method as disclosed in NPL 1 and NPL 2, a fine pattern can be formed with passing the limit determined by a wavelength of a beam of a projection exposure device. However, since a process or a material different from a patterning technology which is used until a shape of a pattern formed in the photomask is directly transferred onto a sample is used, it is desired that evaluation for such a difference is performed. NPL 1 and NPL 2 do not disclose such an evaluation method, and PTL 1 also does not disclose a technology of evaluating a pattern which is not provided in a photomask for methods of DSA, SADP, SAQP, Self Aligned Octuple Patterning (SAOP).

Hereinafter, a pattern measurement device and a computer program for measuring a pattern will be described, which are for the purpose of adequately evaluating a pattern formed by a patterning method in which a pattern which is not provided in a photomask is formed.

Solution to Problem

As an aspect for achieving the abovementioned purpose, a pattern measurement device is proposed. The pattern measurement device includes a computation device that measures dimensions between patterns formed in a sample, by using data which is obtained by irradiating the sample with a beam. The computation device extracts the centroid of the pattern formed in the sample, from data to be measured obtained by irradiation with the beam, executes a position alignment process between the extracted centroid, and measurement reference data in which a reference functioning as a measurement start point or a measurement end point is set, and measures dimensions between the measurement start point or the measurement end point of the measurement reference data subjected to position alignment, and the centroid or an edge of a pattern contained in the data to be measured.

As another aspect for achieving the abovementioned purpose, a pattern measurement device is proposed. The pattern measurement device includes a computation device that measures dimensions between patterns formed in a sample, by using data which is obtained by irradiating the sample with a beam. The computation device acquires pattern data formed by patterning with a contraction projection exposure device, and obtains a centroid position of a pattern generated by a self-derivative assembly process, or a pattern formed by a multi-patterning method, between patterns of the pattern data or within the pattern, based on the pattern data.

Advantageous Effects of Invention

According to the configuration, it is possible to adequately evaluate a pattern formed by a patterning method in which a pattern which is not provided in a photomask is formed.

BRIEF DESCRIPTION OF DRAWINGS

FIG. 1 is a diagram illustrating an outline of a scanning electron microscope.

FIG. 2 is a diagram illustrating an example in which dimensions or a pitch of patterns is measured.

FIG. 3 is a diagram illustrating an example in which a grid functioning as a measurement reference is disposed on an SEM image.

FIG. 4 is a flowchart illustrating a registration process of grid line information for an SEM image.

FIG. 5 is a flowchart illustrating a registration process of grid line information for design data.

FIG. 6 is a flowchart illustrating an outline of a measuring procedure using a grid line.

FIG. 7 is a diagram illustrating an example of an SEM image of a DSA pattern (FOV image at the magnification of 200 K the actual size).

FIG. 8 is a diagram illustrating an example of a measurement system including a scanning electron microscope.

FIG. 9 is a diagram illustrating an example in which grid lines are disposed in design data.

FIG. 10 is a diagram illustrating an example of a database indicating a relationship between identification information of a pattern and grid positions functioning as the measurement reference.

FIG. 11 is a diagram illustrating an example of an image generated based on mask data for a guide pattern.

FIG. 12 is a diagram illustrating an example of an SEM image obtained by capturing the guide pattern.

FIG. 13 is a diagram illustrating an example in which the centroid of a DSA pattern is superimposed on the grid lines.

FIG. 14 is a diagram illustrating a display example of a grid measurement result.

FIG. 15 is a diagram illustrating an example of an output screen of grid measurement data.

FIG. 16 is a diagram illustrating a display example of the grid measurement result.

FIG. 17 is a diagram illustrating a display example of the grid measurement result.

FIG. 18 is a diagram illustrating a display example of the grid measurement result.

FIG. 19 is a diagram illustrating an example of displaying distribution of grid measurement results.

FIG. 20 is a diagram illustrating an example in which an SADP pattern is measured by using a grid.

FIG. 21 is a diagram illustrating an analysis example of a result obtained by measuring the SADP pattern with the grid.

FIG. 22 is a diagram (normal) illustrating a determining method of a reference grid line when the SAQP pattern is measured.

FIG. 23 is a diagram (core pattern error) illustrating the determining method of the reference grid line when the SAQP pattern is measured.

FIG. 24 is a diagram (1st spacer error) illustrating the determining method of the reference grid line when the SAQP pattern is measured.

FIG. 25 is a diagram illustrating an example in which hole patterns formed by SADP are grouped.

FIG. 26 is a diagram illustrating a patterning process by the SADP.

FIG. 28 is a diagram illustrating a technique of obtaining a centroid position of a pattern formed by DSA, from guide pattern data (design data) of the DSA.

FIG. 29 is a diagram illustrating an output example of a measurement result obtained by using centroid position information which has been created based on the design data.

FIG. 30 is a flowchart illustrating a measurement process of using the centroid position information which has been created based on the design data.

FIG. 31 is a diagram illustrating a technique of obtaining the centroid position of a pattern formed by DSA, from the guide pattern data (design data) of the DSA.

FIG. 32 is a diagram illustrating an output example of the measurement result obtained by using the centroid position information which has been created based on the design data.

FIG. 33 is a diagram illustrating a technique of obtaining the centroid position of a pattern formed by DSA, from the guide pattern data (design data) of the DSA.

FIG. 34 is a diagram illustrating an output example of the measurement result obtained by using the centroid position information which has been created based on the design data.

FIG. 35 is a diagram illustrating a technique of obtaining the centroid position of a pattern formed by DSA, from the guide pattern data (design data) of the DSA.

FIG. 36 is a diagram illustrating an output example of the measurement result obtained by using the centroid position information which has been created based on the design data.

FIG. 37 is a diagram illustrating a process of generating a line pattern of SAQP from the design data.

FIG. 38 is a diagram illustrating a method of generating pattern data based on the design data.

FIG. 39 is a diagram illustrating a technique of specifying the centroid of a line pattern based on the design data.

FIG. 40 is a diagram illustrating a grid measurement method for Dense Hole Pattern.

FIG. 41 is a diagram illustrating an output example (distribution display) of a measurement result of Dense Hole Pattern.

FIG. 42 is a diagram illustrating a measurement example of using a grid line of a DSA pattern.

FIG. 43 is a diagram illustrating an example of orthorhombic lattice data used in measuring the grid.

FIG. 44 is a diagram illustrating an example of hexagonal lattice data used in measuring the grid.

FIG. 45 is a diagram illustrating an example of rectangular lattice data used in measuring the grid.

FIG. 46 is a diagram illustrating an example of parallelogram lattice data used in measuring the grid.

FIG. 47 illustrates an example of selecting a lattice and inputting a pitch.

FIG. 48 is a diagram illustrating an example of an input screen for inputting a parameter when DSA pattern data is created based on the design data.

FIG. 49 is a diagram illustrating an example of a DSA pattern generated based on the input parameter.

DESCRIPTION OF EMBODIMENTS

Figure 27A:
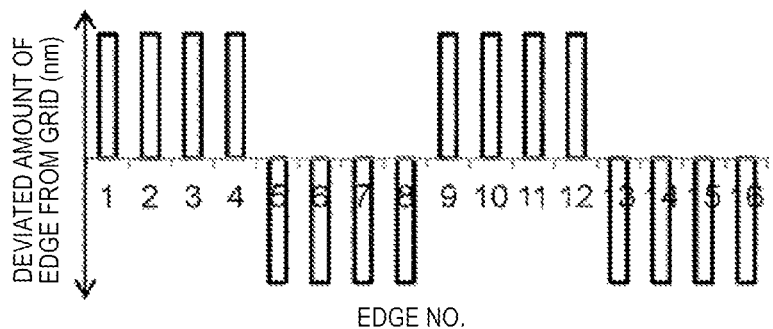
FIGS. 27A-27D are diagrams illustrating of an output example of a grid measurement result of SAxP.

A new patterning method such as DSA and SAxP is different from a general pattern forming method in lithography, and can simply achieve fineness. The patterning method has characteristics in that variance of various processes or materials causes a shape of the pattern to be change. Simplification of a device pattern is also in progress, in employing this technology. Representatively, the Gridded Design method is provided as a design technique. In this method, the device pattern is caused to be straight as much as possible and disposed on the aligned grid. The method is appropriate when the above-described SADP method or DSA technology is applied. In this manner, large revolution in the micro-machining technology has been developed.

An example which will be described below is for realizing high-accurate fine processing and manufacturing of high-performance device, by precisely recognizing and measuring variance of dimensions in the latest pattern forming technology.

In a measuring method using an electronic beam, edges are recognized from distribution of intensity of secondary electrons or reflection electrons from the edges of a pattern to be measured, an interval between desired edges is obtained, and a dimension (CD: Critical dimension) of a pattern, a pitch between patterns, and the like are obtained. When such measurement is performed, it is conceivable that reference lines are disposed to interpose therebetween an edge which is desired to be obtained, and the edge is recognized from intensity distribution of the secondary electrons and the like inside the area interposed between the reference lines, and thus a measurement position is selected. However, regarding a pattern which is set as an evaluation target, setting the reference lines at appropriate positions in accordance with the evaluation purpose is required.

Meanwhile, the example relates to a measurement technology in a manufacturing process in the semiconductor manufacturing process, in order to realize improvement of manufacturing yield of a device. Particularly, the example relates to a dimension measurement method when a so-called self-aligned pattern forming process in which the number of a pattern is increased to be n times is used using a process technology or characteristics of a material, and a measurement device appropriate for the dimension measurement method.

In general pattern formation using lithography, a mask pattern is transferred onto a wafer by using the contraction projection exposure device. In this method, since a pitch between patterns is ensured by the mask pattern, an error quantity is very small, and can be ignored. Accordingly, evaluation of performance in pattern formation is mainly performed by using a dimension (CD: Critical dimension) of a pattern. Margin management of Overlay which is an important management item in manufacturing a semiconductor may be performed by managing a position alignment error between different layers, and a dimension (CD: Critical dimension) of a pattern. However, in a case of using a self alignment process and the like, a side wall pattern such as an Atomic layer deposition (ALD) layer is used as a pattern, in addition to a pattern which is formed by lithography and is referred to as a core pattern. The side wall pattern is formed on the periphery of a core pattern by self aligning. Accordingly, a film thickness error of ALD or dimensions of a core resist pattern cause variance of a position of a pattern.

Accordingly, changing of a process such as ALD film formation causes variance of the position of a pattern in addition to CD. In simple dimension measurement, CD measuring of a line width of a pattern or an interval between patterns is performed, but is inappropriate for measuring the position of a pattern. That is, this is because any pattern of which the position can be specified is not provided on a measurement screen.

In the example, a method of totally evaluating CD variance or position variance is provided. Thus, it is possible to evaluate position information of a pattern edge which also includes a position error of a pattern, to prevent deterioration of device characteristics due to the Overlay error in advance, and to improve the manufacturing yield of a device.

In the measurement of the example, the position of the centroid or an edge of a pattern is expressed by a deviated amount from a reference line or a reference point. Specifically, a plurality of reference lines or reference points is disposed on almost entirety of a CD-SEM measurement screen. Each pattern edge or the centroid of each pattern is aligned with the reference lines. Then, a distance between the pattern edge, and the reference line or the reference point is measured. Disposition of the reference line or the reference point can be selected from a method in which the reference line or the reference point is automatically measured from an array of patterns to be measured and disposed, and a method in which the reference line or the reference point is displayed by inputting a design value.

A case where a measurement pattern for determining a reference pitch and reference position is disposed in addition to a pattern to be measured, and a pattern pitch between the patterns is obtained or a position of the reference line is obtained is effective for improving accuracy of measuring. In addition, a function of correcting distortion of a measurement screen may be also added. A chip in which a pattern for correction is formed may be disposed in the measurement device. A measurement result of the pattern for correction may be applied to screen distortion correction, and may provide a function of disposing a reference line or a reference point by matching with the distortion of the screen.

In the example, a device and a computer program appropriate for evaluating a pattern formed by a self-aligned n-fold pattern forming method, or a pattern forming method using a self-derivative assembly material will be described. According to the example, in manufacturing a tip-end device, performance in forming a pattern may be managed, and accuracy of dimensions and a position may be improved. Thus, it is possible to largely contribute to improvement of manufacturing yield and to stabilization.

FIG. 1 is a block diagram illustrating an outline of a configuration of a scanning electron microscope. A total control unit 125 controls the entirety of the device through an electron optical-system control device 126 and a stage control device 127, based on information of an acceleration voltage of an electron, information of a wafer 111, and observation position information, and the like, which are input from a user interface 128 by a worker. The wafer 111 is fixed onto a stage 112 which is in a sample chamber 113 via a sample transporting device (not illustrated), after passing through a sample exchange chamber.

The electron optical-system control device 126 controls a high-voltage control device 115, a first condenser lens control unit 116, a second condenser lens control unit 117, a secondary electron signal amplifier 118, an alignment control unit 119, a deflection signal control unit 122, and an objective lens control unit 121, in accordance with commands from the total control unit 125.

A primary electron beam 103 is extracted from an electron source 101 by an extraction electrode 102. The primary electron beam 103 is converged by a first condenser lens 104, a second condenser lens 106, and an objective lens 110. A sample 111 is irradiated with the converged electron beam. The electron beam in the middle of irradiation passes through a diaphragm 105. An alignment coil 108 causes a track of the electron beam to be adjusted. Then, the sample is two-dimensionally scanned with the electron beam by a deflection coil 109. The deflection coil 109 receives a signal from a deflection signal control unit 122 through a deflection signal amplifier 120. Secondary electrons 114 are emitted from the sample 111 by irradiating the wafer 111 with the primary electron beam 103, and the emitted secondary electrons 114 are caught by a secondary electron detector 107. The caught secondary electrons 114 are used as a luminance signal of a secondary electron image display device 124 through a secondary electron signal amplifier 118. Since a deflection signal of the secondary electron image display device 124 is synchronized with the deflection signal of the deflection coil, a pattern shape on the wafer 111 is reliably reproduced on the secondary electron image display device 124. An image processing processor 123 or the secondary electron image display device 124 may be a general-purpose computer or monitor. A storage device 1231 is connected to the image processing processor 123. The image processing processor 123 may read registered information, if necessary. In order to create an image used for measuring dimensions of a pattern, a signal output from the secondary electron signal amplifier 118 is subjected to AD conversion in the image processing processor 123, so as to create digital image data. A secondary electron profile is created from the digital image data.

A range measured from the created secondary electron profile is manually selected or automatically selected based on a predetermined algorithm. The number of pixels in the selected range is calculated. Actual dimensions of the sample are measured based on actual dimensions of an observation region which is scanned with the primary electron beam 103, and the number of pixels corresponding to the observation region.

In the above descriptions, the descriptions will be made by using a scanning electron microscope with an electron beam as an example of a charged particle beam device. However, it is not limited thereto. For example, an ion beam irradiation device using an ion beam may be used. In the following descriptions, an execution entity that executes processing which will be described later may be also referred to as a computation processing device.

FIG. 8 is a diagram illustrating an example of a measurement system which includes a scanning electron microscope. The system includes a scanning electron microscope system. The scanning electron microscope system includes an SEM main body 801, a control device 802 of the SEM main body, and a computation processing device 803. A computation processing unit 804 and a memory 805 are mounted in the computation processing device 803. The computation processing unit 804 supplies a predetermined control signal to the control device 802, and executes signal processing of a signal obtained in the SEM main body 801. The memory 805 stores the obtained image information or recipe information. In the example, descriptions will be made for a case in which the control device 802 and the computation processing device 803 are separate from each other. However, an integrated type control device may be used.

Beam scanning by a deflector causes electrons to be emitted from the sample or causes to electrons to be generated by a conversion electrode. The emitted electrons or the generated electrons are caught by the detector 806. The caught electrons are converted into a digital signal by an A/D converter mounted in the control device 802. Image processing in accordance with the purpose is performed by image processing hardware such as CPU, ASIC, and FPGA, which is mounted in the computation processing device 803.

The computation processing unit 804 includes a profile creation portion 807 and a measurement processing execution portion 808. The profile creation portion 807 creates a waveform profile based on a signal detected by the detector 806. The measurement processing execution portion 808 measures dimensions of a pattern, based on a waveform profile created by the profile creation portion 807, or based on a signal waveform obtained by performing primary differentiation or quadratic differentiation on a waveform of the signal. As will be described later, in the measurement processing execution portion 809, dimension measurement processing is executed between a set grid, and the centroid of a pattern (in a case where the centroid and the center are equal to each other, the center may be used). In this case, for example, a difference of coordinate values extracted in a sub-pixel unit, and/or a vector thereof may be set as a measurement result. In the pattern centroid computation portion 810, a centroid position (coordinate) of a pattern is extracted from pattern data obtained based on design data or simulation data, edge information of a pattern included in an SEM image, and contour line data of a pattern, which is extracted from pattern edge information. As a technique of obtaining a centroid position, for example, in a case of a circular pattern, a method in which a distance image is created by using a position of an edge as a reference, a position farthest from an edge in a closed shape is detected, and thus the centroid is obtained may be provided. In addition, a method in which a closed shape formed from a polygon is divided into a plurality of triangles, and an area of the triangles and the centroid are multiplied, and a result of multiplication is divided by the entire area, thereby the centroid is obtained may be provided.

In the position alignment processing portion 811, position alignment between both pieces of data is performed so as to cause a pattern centroid position obtained based on design data or pattern data of simulation data to match with a pattern centroid position obtained based on edge data of an SEM image and the like. In the example which will be described below, descriptions will be mainly made by using an example in which position alignment is performed between centroids of a plurality of patterns. In this case, position alignment between both pieces of data is executed so as to cause the sum value of distances between the corresponding centroid positions to be smallest.

The position-aligned pattern selecting portion 812 selects a pattern used in the position alignment (used in extracting a centroid position for the position alignment), based on a predetermined reference. For example, in a case where a pattern formed by SAxP is evaluated, if the position alignment is also performed on patterns including other patterns, adequate evaluation is not possible. Thus, in order to automatically select a pattern for position alignment in accordance with an evaluation purpose, the position alignment pattern measurement portion 812 selectively reads a region which is stored in the design data storage medium 814 and is created by SAxP, based on a measurement purpose or measurement target pattern information which is input by an input device 815. The read region is registered as an image for position alignment, in the position alignment processing portion 811. Alternatively, the position alignment pattern measurement portion 812 reads design data of regions which include a pattern region created by SAxP, and other regions, and causes a pattern formed by SAxP to be selectively registered as an image for position alignment.

The computation processing device 803 specifies or measures an edge or a pattern based on measurement conditions and the like input by the input device 815. A design data extracting portion 813 is mounted in the computation processing unit 804. The design data extracting portion 813 reads design data from the design data storage medium 814 in accordance with the conditions input by the input device

815, and, if necessary, converts vector data into layout data. The design data extracting portion 813 extracts information required for measurement which will be described later, from the design data.

A display device is provided in the input device 2515 which is connected to the computation processing device 2503 through a network. The display device displays a GUI on which an image, an examination result, or the like is displayed for an operator.

A portion or the entirety of control or processing in the computation processing device 803 may be assigned to a CPU or an electronic computing device and the like, and thus processing or control may be performed. The electronic computing device has a memory mounted therein, which enables accumulation of images. The input device 815 also has a function as a capturing recipe creation device. The capturing recipe creation device sets measurement conditions as a capturing recipe. The measurement conditions include a coordinate of an electronic device required for measurement, examination, or the like, the type of a pattern, and capturing conditions (optical conditions or moving conditions of a stage). The input device 815 has a function of inquiring the input coordinate information or information regarding the type of a pattern, as layer information of the design data or identification information of a pattern, and of reading necessary information from the design data storage medium 814.

Design data stored in the design data storage medium 814 is expressed in a GDS format, an OASIS format, or the like, and is stored in a predetermined form. The type of the design data is not limited as long as the design data may be displayed in a format form of software by the software for displaying the design data, and may be handled as figure data. The figure data may be line image information which is replaced with line image information indicating a ideal shape of a pattern which is formed based on design data, exposure simulation is performed, and thus on which modification processing is performed so as to be approximate to an actual pattern.

The measurement system illustrated in FIG. 8 includes a photomask-measuring SEM 516 for measuring dimensions of a pattern formed in the photomask. The memory 805 and the like of the computation processing device 803 store a measurement result of the photomask, which is obtained by the photomask-measuring SEM 516, image data, coordinate information, and the like.

Example 1

In the example, a measurement method in which a grid functioning as a reference line (point) is superimposed on an image obtained by the scanning electron microscope (SEM), and thus a pattern is evaluated will be described. FIG. 2 is a diagram illustrating the measurement method for evaluating a pattern based on measurement between edges. Pattern position information which has been registered from a measurement pattern image 200 in advance, or another position of a measurement pattern 201 on an image, which is obtained by recognizing a pattern is determined. Then, a pattern edge is detected based on the position information. A pattern CD (pattern width) 203 or a distance 204 between patterns is calculated based on the edge information. For example, template matching may be performed between a portion of an image cutout by the region designation cursor 205, and another pattern on the image, and thereby a position of the measurement pattern on the image may be detected. In such a measurement method, relative measurement for a line width of a pattern or an interval between patterns is performed. However, it is not clear whether each pattern can be formed on desired coordinates.

In the example, a measurement method in which a grid (measurement reference data) is superimposed on an SEM image (or a contour line image obtained based on the SEM image), and the grid is used as a reference (measurement start point or measurement end point) is proposed. FIG. 3 illustrates an example in which a grid is disposed on an SEM image. A grid arrangement screen 300 displayed in the secondary electron image display device 124 corresponds to an image in which a reference line X301 and a reference line Y302 overlay the measurement pattern image 200. A plurality of reference lines X/Y may be expressed by a certain reference point 303, a pitch X304, and a pitch Y305.

An example in which a pattern is measured based on disposition of a grid pattern will be described with reference to FIGS. 3 and 6. The measurement process using the grid is divided into a process (S600) of registering grid information, and processes (S601-S605) of executing grid measurement.

When grid measurement is executed, grid information which has been registered in advance is read from the storage device 1231 or the memory 805 to the image processing processor 123 or the computation processing device 803 (S601). The image processing processor 123, or the pattern centroid position computation portion 810 of the computation processing device 803 acquires a measurement pattern image (S602), and calculates a pattern centroid 311 from a pattern edge 310 obtained by means illustrated in FIG. 2. As a technique of calculating the centroid position, various techniques are considered. However, for example, an edge of a pattern may be extracted, and then a distance image may be formed by using the pattern edge as a reference, and thus the pattern centroid (or center) may be obtained.

Then, a distance from a measurement reference point 312 which is one of intersection points between the plurality of reference lines X/Y is calculated, and a deviated amount 313 is output. Similarly, the processing is performed on all patterns in the screen, and the reference point 303 is aligned so as to cause the total sum of deviated amounts to be smallest (S603). In this case, in a case where a pattern other than patterns formed by SAxP or a pattern other than patterns formed by self alignment is included in a visual field, alignment can be performed by masking the above pattern (patterns other than a specific pattern are not used as a target of alignment), and thus it is possible to selectively evaluate a pattern formed by SAxP and the like.

It is considered that this processing is not performed in a case where a reference pattern is provided in the measurement screen or out of the screen, and alignment is performed in advance. After the alignment, the reference line is disposed on the screen (S604), and a relative position between the reference line and a pattern is measured (S605). Similarly, the pattern CD 203 may be output simultaneously with preparation of a reference line matching with an edge point, not the centroid. The grid line information may be registered by using an SEM image which has been actually acquired, or may be registered by using design data of a pattern. Since an interval between patterns is (may be) determined in accordance with the type of a high-molecular block copolymer, a database for storing high-molecular block copolymer and grid line information (interval between grid lines) associated with each other may be prepared, and grid line information may be read based on selection of high-molecular block copolymer to be used.

The interval between grid lines is set to be the same as an interval between patterns on the design data. Patterns formed by DSA or SAxP may be formed at the same interval (for example, equal interval) as the grid line, if the pattern is ideally formed like the design data. However, the interval may vary depending on the poorness of a guide pattern or variance of process conditions (for example, variance in film thickness of a layer functioning as a mask layer). As described above, dimensions between centroid positions of a plurality of patterns are measured, and thus information sufficient for figuring out the reason of deviation in addition to simple deviation can be obtained. This point will be described further later.

FIG. 7 is a diagram illustrating an example in which a grid is disposed on an image in which a pattern formed by a DSA method and a guide pattern for applying the DSA method are displayed. The image illustrated in FIG. 7 is acquired at magnification of 200 K (visual field size: 670 nm). A grid pattern (reference pattern) 702 is superimposed on the acquired image 701. The positions of the formed patterns are adequately evaluated in addition to the size of patterns 704 arranged in a guide pattern 703 by the self-derivative assembly phenomenon. Thus, a self-derivative assembly process may be adequately evaluated. The guide pattern 703 is created based on patterning by the contraction projection exposure device. However, the patterns 704 arranged within the guide pattern 703 may not be formed at adequate positions by performance of the guide pattern 703. Particularly, in a case where an edge of the guide pattern is modified or the shape of the guide pattern is distorted, patterns may not be arranged at adequate positions.

In the example of FIG. 7, a guide pattern 705 for a reference pattern 706 is patterned along with the guide pattern 703, and a grid is set by using the reference pattern 706 as a reference. In a case of the example, eight reference patterns are disposed in a visual field of the electron microscope. An interval between the eight reference patterns is set so as to be integer multiple of an interval between DSA patterns arranged within the guide pattern, and grid lines are set to cause the patterns formed by self assembly to be positioned on the grid lines which are equivalently arranged between the reference patterns, on design data. In this manner, appropriate reference patterns matching with the DSA pattern size are set, and thus grid patterns may be positioned at adequate positions.

A registration method of grid line information, which uses an SEM image will be described with reference to FIGS. 4 and 5. The SEM image to be measured is read to the image processing processor 123 or the computation processing device 803 (S401). At this time, as the SEM image, an image which is previously stored in the storage device 1231 or the memory 805 may be used. A user selects whether or not a pattern position is detected by automatic pattern recognition (S402). In a case where automatic recognition is selected, the image processing processor 123 or the position-aligned pattern selecting portion 812 executes automatic pattern recognition (S403), and calculates the detected coordinates of the pattern (S410).

Since, generally, a semiconductor pattern having the same shape is repeated, the cycle of repetition may be automatically recognized through image processing and the like, and thus a pattern position can be detected. In the example, a user determines to perform automatic pattern recognition. If it is determined that recognition is possible at this time, the automatic pattern recognition may be also applied when measurement is executed. In a case where automatic recognition is not selected, the user designates a pattern region to be measured as with the region designation cursor 205 (S404). As described above, a pattern formed by the DSA method may be selectively extracted from design data or simulation data, and the extracted pattern may be used as a template for pattern recognition (image for pattern centroid extraction).

The image processing processor 123 or the computation processing device 803 detects a pattern (S405), and calculates the detection coordinates of the pattern similarly to automatic pattern recognition (S410). A neighboring pattern which causes a distance from a pattern in a detected pattern coordinate group to be smallest is detected (S411).

A distance in which the distance between the neighboring patterns is the smallest is calculated in an X direction and a Y direction, and thus a pitch is determined. As another calculation method of a pitch, the following methods are considered: a method in which a pitch is obtained from a projection waveform in the X/Y directions or a direction in which patterns are provided, by using a distance between peaks; a method in which a pitch is calculated by spatial frequency analysis; and a method in which a pitch is calculated by using a self regression model.

Coordinate of a virtual grid line is generated simultaneously with calculation of a pitch (S412). The pattern measurement is executed, and a pattern CD and pattern centroid coordinates are obtained from an edge point group which is detected during measurement (S413). The grid line corrects the virtual grid line by using the pattern centroid coordinates. The coordinates of an auxiliary grid line are simultaneously generated by using the pattern CD, and the generated coordinates are displayed in the secondary electron image display device 124 (S414).

In a case where there is no reference pattern, the process proceeds to confirmation (S425), and is ended. In a case where the reference pattern is provided, the reference pattern region is designated (S421) or the reference line is designated (S422). In a case where the reference line is designated, the centroid coordinates of the reference pattern are detected and are calculated again. The grid line, the auxiliary grid line, and the reference line are corrected based on the re-calculated information, and the corrected lines are displayed in the secondary electron image display device 124 (S424).

In the example, as one aspect, a technique in which a reference pattern is created separately from a pattern functioning as the measurement target, and position deviation of a measurement target pattern is evaluated based on position alignment using the created reference pattern is described. In a case of a pattern included in the guide pattern set to be forming one DSA pattern (hole pattern), since a plurality of patterns is formed, deviation does not occur in comparison to a pattern included in a guide pattern set to form a plurality of hole patterns. Thus, it is possible to adequately evaluate deviation occurring by a specific cause (in a case where a plurality of patterns is contained within the guide pattern). The position alignment is performed by using a plurality of reference patterns, and thus it is possible to equalizing deviation of patterns, and as a result, to perform position alignment with high accuracy.

Even when the position alignment is performed by using the centroid of a pattern functioning as a measurement target, as a reference, a plurality of patterns is set as a target of the position alignment, and thus a pattern having deviation larger than other patterns may become apparent.

A pattern included in a plurality of guide patterns is set as a target of the position alignment, and thus deviation occurring by application of the guide pattern can become apparent.

Example 2

A method in which the grid line, the auxiliary grid line, or the reference pattern position coordinate is acquired by using the design data will be described with reference to FIGS. 5, 9, and 10. The image processing processor 123 and the like read the design data stored in the storage device 1231 and the like (S501). The design data may be acquired from an external network or an external medium. The size of the visual field or a position on a wafer is designated (S502), and an image 900 generated from the design data is displayed in the secondary electron image display device 124 and the like. Pattern position coordinate information is calculated or is acquired by position designation of a user (S503). The shortest distance from the coordinate position information of each pattern is calculated in the x-direction and the y-direction (S504), and pitches Px901 and Py902 are calculated (S505).

In addition, the pattern size is also acquired by calculation or by an input (S506). A grid line 903 or an auxiliary grid line is generated from the calculated pitch and pattern size information (S507), and the generated line is displayed in the secondary electron image display device 124 (S508).

If a reference pattern is provided, similarly, coordinate information thereof is acquired (S509). The reference line 903 is displayed in the secondary electron image display device 124 along with the above-described line (S510). The display is confirmed (S511) and the process is ended.

FIG. 10 is a diagram illustrating an example of the database in which a combination of a pattern functioning as the measurement target, and association information is stored. In the example, Pattern No. is prepared as an Id of each of all patterns. Then, Group No. is assigned in order to distinguish between the DSA pattern and the reference pattern. Here, the reference pattern is assigned as Group 1, and the DSA pattern is assigned as Group 2. Regarding reference patterns (Pattern No. 1, 2, 6, and 7), one pattern is created for one guide pattern. Thus, data of the mask and data of the guide pattern are stored together. However, regarding DSA patterns in the example, three DSA patterns are created as one guide pattern, and mask data and guide pattern data which have one-to-one correspondence are not provided. Thus, mask data and guide pattern data corresponding to Pattern No. 3, 4, and 5 are not stored in the database illustrated in FIG. 10.

In the database illustrated in FIG. 10, grid coordinates (Xn, Ym) on an image are assigned to each pattern. At this time, the Mask pattern used in the lithography is stored as another attribute. Similarly, a pattern used as the Guide Pattern is also set as another attribute. Finally, a measurement pattern position is obtained. Pitch information of another grid line or coordinates functioning as an origin point are separately stored.

In this manner, grid line information functioning as a measurement reference is registered in advance, based on design data or mask data in which a pattern is disposed at an ideal position, and thus measurement conditions for allowing evaluation of an error factor which is specific to the DSA pattern can be made to be a measurement recipe.

Example 3

An example in which the measurement method using the grid is applied in measuring patterns which are formed by the self-derivative assembly process and Directed Self Assembly (DSA) will be described with reference to FIGS. 11, 12, and 13.

FIG. 11 illustrates that mask data for the guide pattern is generated as a pattern image and the generated mask data is displayed. The mask data is obtained by adding OPCs to the pattern image for the design data. In the actual mask pattern, patterns 3, 4, and 5 overlap each other, so as to form one pattern 1102. Thus, a pattern position 1103 obtained in such a manner that coordinate data 1010 obtained from the design data or grid line 1100 overlap the mask pattern image, and a result of overlapping is displayed can be confirmed.

For example, regarding the mask pattern data, in a case where design data of the mask pattern is stored in the design data storage medium 814, the stored data may be read and used as the mask pattern data or image data obtained by the photomask-measuring SEM 516 may be used.

FIG. 12 illustrates an SEM image obtained by capturing a guide pattern 1201 which is formed by a lithography process. A centroid position 1202 of the guide pattern 1202 in the SEM image, a reference line 1203 calculated from the centroid position, and a mask pattern displayed in FIG. 11 or the formed pattern position are rewritten. At this time, the reference line 1203 may be corrected by using the centroid positions of the guide patterns 1, 2, 3, and 4. Similarly, a pitch between grid lines may be corrected by using the reference line 1203 as a reference.

FIG. 13 illustrates overlapping between the centroid of a DSA pattern detected in an SEM image obtained by capturing the DSA pattern (which has been actually formed) and the guide pattern, and the grid line. With this illustration, it is possible to easily confirm deviation between DSA patterns 1, 2, 6, and 7 formed singly within the respective guide patterns and the reference line, and deviation between three patterns 3, 4, and 5 formed within the guide pattern and the grid line.

Example 4

An output example method of grid measurement will be described below with reference to FIGS. 14 to 19. FIG. 14 illustrates a display example of a grid measurement result. FIG. 15 illustrates an output screen example of grid measurement data. In FIG. 14, the centroid of a DSA pattern detected on an SEM image obtained by capturing the DSA pattern and the guide pattern, a grid line and a deviated amount from coordinates of the target are displayed by using a vector 1410.

In a case where the deviated amount 1410 is small and visibility is low, vector magnification which is increased in a pull-down menu for changing a vector size 1512 of a magnification changing screen 1511 in FIG. 15 may be selected. A vector 1413 expanded in accordance with the selected magnification is displayed. Detailed pattern data may be confirmed on a data display screen 1501. Selection and display is performed by using the type 1505 of data 1502 to be confirmed. Pieces of data may be sorted by a sorting button 1503. The total value 1504 of various types of data is also displayed together.

FIG. 16 illustrates an example in which only grouped data is filtered and displayed. A data group to be desired to be displayed may be selected by using a check box 1613 of a data grouping window 1610. The selected data of a pattern is interlocked with deviated amount vectors 1601 on an SEM image 1600. Among the vectors, the color of only a vector corresponding to the selected pattern is changed and displayed. The selected pieces of data may be sorted by an ascending order button 1611 or a descending order button 1612.

FIG. 17 illustrates an output data type. In addition to deviated amounts in the X direction and Y direction, a distance ΔGrid(R) or an angle ΔGrid(θ) calculated by the following expression may be output.

$$\Delta Grid(R) = \sqrt{(\Delta Grid(x)^2 + \Delta Grid(y)^2)}$$

$$\Delta Grid(\theta) = \arctan(\Delta Grid(y)/\Delta Grid(x))$$

FIG. 18 illustrates an output example in a case where a pattern is not normally formed by, for example, changing the process and is formed as a defect. In a case where a pattern is not provided at a position defined by the grid, a symbol 1802 for recognizing the defect is displayed on the data display screen. As in the example, the number of detected patterns 1803 is changed from 5 to 4. Regarding display on an SEM image, a mark 1800 is displayed by using coordinates of the registered data.

FIG. 19 illustrates a distribution diagram of deviated amount in grid measurement. Regarding a pattern in which deviation exceeding a management range which is designated by a user, the color of a vector displayed for the pattern on an SEM image is changed and displayed. The distribution may be displayed in a radial direction and an angular direction in addition to the X/Y directions.

Example 5

FIG. 20 illustrates an example in which the above-described grid line is superimposed on an SEM image or a contour line data obtained from the SEM image, and a technique of executing measuring with the grid line as a reference is applied in measuring a pattern. The pattern is formed by Self Aligned Double Patterning (SADP) in which the number of patterns is increased to be twice by self alignment. In the example, reference lines (G4, G8, and G12) are set between line patterns. In a case where a pattern formed by patterning through self alignment is evaluated, a measurement reference is disposed at an adequate position, and thus a process state in each of processes for SADP may be adequately evaluated. In a case of the example, a reference line is set in the centroid of a space pattern (centroid position between two edges in a direction perpendicular to a longitudinal direction of a pattern edge), and reference lines (G3, G5, G7, G9, G11, and G13) for evaluating edge deviation are set at positions which is separated from the reference line at a predetermined distance (for example, the half of a space pattern width on the design data). A difference between the reference line and a position of an actual edge, that is, for example, G5-E3 or G7-E4 (E indicates a position of an edge (or a contour line obtained based on the edge)) is obtained by using the reference lines. Thus, it is possible to obtain deviation of an actual edge position from the original edge position.

In the example, setting of a reference line (second reference line) for evaluating deviation is performed based on setting of a reference line (first reference line) to the centroid position of a space pattern. The above-described setting is due to the following reason.

FIG. 26 is a diagram illustrating a portion of a pattern forming process by the SADP, and is a diagram obtained by viewing a formed pattern from a section direction. Firstly, a pattern 2601 is formed on a substrate 2600 by patterning which uses a contraction projection exposure device. A mask layer 2602 is formed on the substrate 2600 on which the pattern 2601 has been formed. Appropriate etching is performed on the substrate on which the mask layer 2602 has been formed, and a state where a spacer 2603 and the pattern 2601 remain occurs. Further, the pattern 2601 is etched, and thus the spacer 2603 remains. The spacer 2603 is formed so as to have density of twice density of the pattern 2601 which is patterned by an exposure device. Thus, etching is performed by using the spacer as a mask and thus patterning which exceeds an exposure limitation of the exposure device may be performed.

Regarding a line portion of a pattern formed through the above-described processes, an edge position or a centroid thereof may be changed due to an extent of the film thickness of the mask layer 2602 or etching conditions. Regarding a space portion, a position of an edge may be changed due to the film thickness or an extent of etching, but the centroid position 2604 is not changed by the conditions. Accordingly, in a case where the process specific to the SADP is evaluated, measuring is performed by using a space centroid as a reference, and thus the process may be evaluated with high accuracy, without an influence of changing the process.

In FIG. 21, reference lines (4x and 8x) are set in the centroid of a space, and three reference lines (5x, 6x, and 7x) are further set to be equivalently arranged between the reference lines (4x and 8x). In addition, reference lines (1x, 2x, 3x, 8x, 9x, 10x, and 11x) are arranged at an interval which is equal to an interval between the three reference lines. If the measurement result is referred, it is understood that variance of dimensions of the adjacent space pattern is large, and dimensions of a core resist pattern is close to a limit of the management range 2101. It is understood that the spacer 2603 is formed so as to be small, from such tendency. If histograms in which the measurement result (relative distance) is set as a horizontal axis and an appearance frequency is set as a vertical axis are created for the right side of a line and the left side of a line, in a normal case, one peak having a normal value as a center is shown. However, in this case, two peaks are shown due to the process conditions. This is a phenomenon specific to the SADP, in which pattern variance by specific process conditions is expressed at an interval of one piece in a line pattern. A display as illustrated in FIG. 21 is displayed in the display device of the input device 815, and thus an operator can visually figure out performance of the sample.

FIG. 22 illustrates an example in which a grid measurement method performed based on the above-described setting of the reference lines is applied in the Self aligned quadruple patterning (SAQP) method in which the number of patterns is increased to be four times by self alignment. FIG. 22 schematically illustrates a sectional shape in each process, and a planar shape of a pattern which is finally obtained, in a case where the process of the SAQP is normally performed. FIG. 22 illustrates dimensions of the obtained pattern and dimensions of a space. Line dimensions and space dimensions may be formed so as to be good in the desired management range. In this case, pitch setting or position alignment of the grid may be performed by using a center position of each space as a reference. In the general process, dimensions may be out from the desired value due to a certain process error.

FIG. 23 illustrates an example in a case where an error occurs in the first core pattern formation. In a case where the CD of a core pattern is formed so as to be thin, the space CD of S2 is thin and the space CD of S4 is thin in the final dimension distribution. Since other spaces do not receive an influence of the core pattern, dimensions do not vary. As the feature, it is recognized that dimensions of S2, S4, and S6 are deviated from the target, but the position of the pattern center is on the grid and the pattern center position does not vary. It is recognized that other space CDs other than S2, S4, and S6 are set as target values, but a space center position is deviated from the target grid. Accordingly, the center positions of S2, S4, and S6 are selected, pitch setting of the grid or position alignment is performed by using coordinates of the selected center, and an error between the disposed grid and each line edge is measured.

A pattern formed by SAQP and the like is a pattern obtained by repeating continuous formation of the same pattern. Thus, identification of the positions of S2, S4, and S6 may be difficult. In such a case, for example, it is considered that a space pattern required for setting a reference line is identified by using periodicity of the feature of the pattern. S2 is a pattern formed between edges of 2nd spacers. The edge is not provided at another edge and has features in accordance with manufacturing conditions of a pattern. For example, it is understood that, if a distance from a certain reference point 2301 of an SEM image to a plurality of edge (peak position of waveform profile) shown in the SEM image is measured, measurement result thereof may be classified for each specific appearance cycle of the feature. For example, a pattern edge having the same type (for example, the left side edges of S10, S14, S18, ... ) is shown for each distance (CD12-CD4) between the CD4 and the CD12. Classification may be performed in accordance with the distance, for each of edges having different types. Such classification may be performed in such a manner that each of the measurement results is divided by a difference value between a plurality of measurement points, and measurement results having the specific remainder (pattern arranged at a specific cycle) are discriminated.

Such classification is performed, and thus an edge having the same type of feature may be identified or identification in a pattern unit may be performed. If, regarding a signal waveform, distinguishment from a pattern region (pattern region which does not have periodicity) formed by methods other than the SAQP and the like is performed further, and a start point of a pattern formed by the SAQP and the like is specified, an edge which is set as a target by the classified measurement result may be specified from arrangement information of the known SAQP pattern. In the grid setting portion 809 of the computation processing device 803, a region required to set a reference line is specified based on specifying of the above-described edge or pattern, and a setting position of the reference line is specified based on computation of the pattern centroid computation portion 810. In a case where a start point of a pattern of the SAQP is known in advance, a specific target pattern may be selected based on order information of edges.

FIG. 24 illustrates an example in a case where an error occurs in forming the 1st spacer. In the example, the core pattern is normally formed, but the 1st spacer is formed so as to be thicker than the target. The space CDs of S1, S3, S5, and S7 are formed so as to be larger than the target, and have substantially the same dimensions. It is recognized that the pattern center is deviated from the reference grid.

S2, S4, and S6 have different CDs, but the center of the spaces thereof matches with the grid. Accordingly, the center positions of S2, S4, and S6 are selected, and pitch setting of the grid or position alignment is performed by using coordinates of the selected center, and an error between the disposed grid and each line edge is measured. As described above, grid pitch setting and position alignment in the SAQP is performed in accordance with the following rules, for example. In a certain consecutive space pattern, a pattern group in which dimensions of a space are different at one piece except for a pattern group in which dimensions of a space are the same at one piece is recognized, and thus the center position of the space pattern is obtained.

As described above, a centroid position of a pattern created in an exposure process before the multi-patterning process is set as a reference, and another reference position is set or deviation of an edge from the reference line is evaluated. Thus, it is possible to accurately specify deviation specific to the multi-patterning.

Figure 27B:
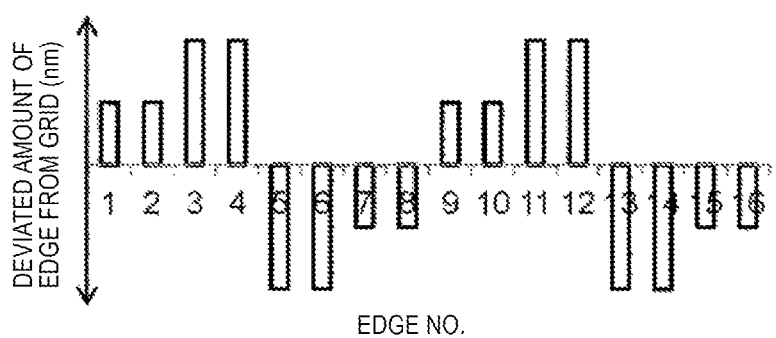
Figure 27C:
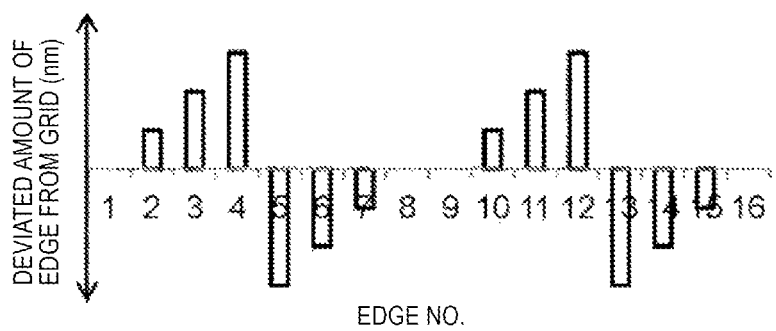
Figure 27D:
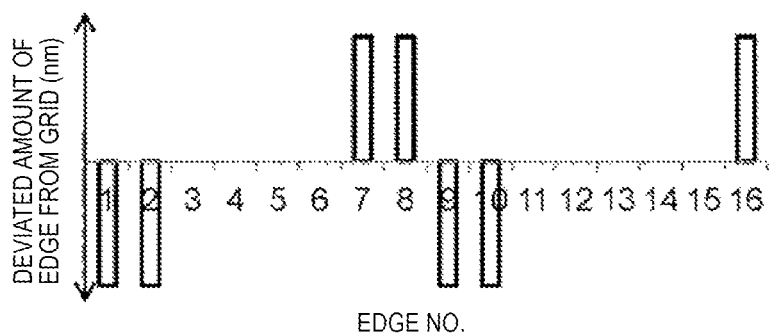

FIG. 27 is a diagram illustrating an example in which results obtained by measuring a distance (deviated amount) between the disposed grid (reference line) and an edge (peak of waveform profile or extracted contour line) are grouped. FIG. 27(a) illustrates an example in which the core resist pattern is formed so as to be −4 nm. FIG. 27(b) illustrates an example in a case where the core resist pattern is formed so as to be −4 nm and the 1st spacer is formed so as to be +1 nm. FIG. 27(c) illustrates an example in a case where the 2nd spacer is formed so as to be +1 nm in the state of (b). FIG. 27(d) illustrates an example in a case where the 1st spacer is formed so as to be −2 nm. A horizontal axis in the figure indicates No. of an edge. For example, a line between Edge 1 and Edge 2 is formed. A space is formed between Edge 2 and Edge 3. As understood from the figure, as illustrated in (a), in a case where only the core pattern varies, the (+) shift and the (−) shift are repeated for each of four edges. In a case where two types of process changes are provided in (b), deviation of edges is shown at two stages. As illustrated in (c), in a case where three types of process changes are provided, deviation of edges is shown at three stages. As illustrated in (d), similarly to (a), even in a case where one type of process change is provided, four edges which do not vary are provided in a case of variance of the 1st spacer. As the fact commonly shown in (a), (b), (c), and (d), it is indicated that symmetry of (+) and (−) are provided between Edge 4 and Edge 5, between Edge 8 and Edge 9, and between Edge 12 and Edge 13, and the center coordinate of a space pattern created by the edges is 0.

As described above, there is the feature in that distribution of edge deviation is analyzed, and thus an error of the process can be detected. That is, the deviated amount of an edge from the ideal state is analyzed, and thus all pieces of information can be analyzed in comparison to a case where simply information of only line dimensions or information of only space dimensions is analyzed. The feature is effective for detecting the process change and the like.

A combination of the above-described deviation factor in the multi-patterning, and a measurement result is formed in a form of a database, and thus the process change factor can be specified based on referring of the database. More specifically, for example, a database indicating a relationship between an occurrence pattern of the deviated amount (sign of the occurring deviation or relationship information of the relative size between the deviated amount), and the process change factor is registered in advance in the memory 805. In the database, a measurement result output from the measurement processing execution portion 808 is referred, and thus, the process occurrence factor is extracted. Process occurrence factor information may be output to the display device of the input device 815, and thus the operator can specify the process change factor without analysis of measurement results for himself.

Example 6

FIG. 25 is a schematic diagram of a process in which self-aligned line patterns are formed in a horizontal direction and a vertical direction, and hole patterns are formed at portions at which the formed patterns respectively overlap space portions. In order to manage a change of the process and the like, a user divides hole pattern into four groups, and measures the hole pattern, and outputs an average value of each group. When a recipe is registered, a length measurement cursor is required to be disposed in all hole patterns, with a consideration of a group, in the related art. In the present invention, IDs of the grid lines are combined, and thus a group may be defined. As shown in the table, such setting in which Row/Column have an odd number in Group 1, and Row has an even number, and Column has an odd number in Group 2 is performed, and as in such setting, disposition of the length measurement cursor and group definition may be performed by small parameter setting.

Example 7

FIG. 40 illustrates a grid measurement example of hole patterns which are regularly aligned. A grid 4002 may be defined in lattice selection and pitch input which are prepared in advance, and are illustrated in FIG. 48. In addition, a pitch 4013 and a lattice type may be calculated from a coordinate group of a pattern centroid 4001 by using pattern recognition from an image, blob analysis, or the like.

Measurement is executed by using all intersection points of the grid 4002, which are determined in this manner. Deviation from the neighboring intersection point among intersection points between the grid 4002 and centroids 4011 calculated from edge point detected in pattern measurement is measured again, and thus it is possible to statistically find out the deviation from the ideal position. In addition, a diameter 4012, a pitch 4013, or the like may be measured simultaneously. The pattern 4003 in which detection of an edge during the measurement is not possible may be determined to be a defect.

FIG. 41 illustrates a display example of frequency distribution of measurement values of hole patterns. An x axis 4101 indicates a pattern diameter 4108 or the size of a pitch 4106, a ratio of circularity 4108, and the like. A y axis indicates a frequency obtained by measuring patterns or pitches. In the display example of FIG. 41, the number 4105 of all patterns used in calculation, the number 4110 of patterns determined as defects, a histogram 4102 of the pattern diameter or a histogram 4106 of the pitch, a histogram 4104 of circularity, and the like are simultaneously displayed. An average diameter 4108 of patterns, an average diameter 4107 of pitches, or an average 4109 of circularities is calculated and displayed by applying centroids of these histograms or a fitting curve 4106 of normal distribution and the like. Variance such as 3σ may be calculated and displayed.

In this manner, the total data of a plurality of patterns in the screen is visually displayed, and thus stability and the like in a manufacturing process are easily found out. Deviation from the pattern centroid and the grid may be displayed as two-dimensional distribution illustrated in FIG. 19. As data which is additionally output, a ratio between the number of defects and the number of all detected patterns, distribution of directions between patterns, or the like may be provided.

As a method for defining a grid which has regularity, firstly, four lattices illustrated in FIGS. 43, 44, 46, and 47 are selected and determined. FIG. 43 illustrates an orthorhombic lattice. FIG. 44 illustrates a hexagonal lattice. FIG. 45 illustrates a rectangular lattice, and FIG. 46 illustrates a parallelogram lattice. The lattices are used in grid measurement, in accordance with the type of a DSA pattern.

Then, a pitch size of each of the lattices is input. An input pitch varies depending on the type of the lattice selected as illustrated in FIG. 47.

Example 8

FIG. 42 illustrates a grid measurement example of a pattern 4201 formed by DSA. A pattern 4203 is a pattern formed in the conventional process such as a photo process or an etching process. Since a pitch 4213 of the pattern 4203 formed by lithography among the patterns is formed with high accuracy, the pattern 4203 is used for generating a guide grid 4204 as a guide pattern. In the example of FIG. 42, the guide pattern itself functions as a measurement target. Two DSA patterns are formed between the adjacent guide patterns. Particularly, regarding a pattern 4205 which is farthest from the guide pattern, measuring position deviation is required with being separate from other patterns. Even in such a case, individual pattern positions like L0(k), L60(m), and L120(n) may be designated and be grouped.

In this measurement, if only a pitch is designated, an average pitch, angle distribution, or the like may be measured even in a fingerprint ahead of DSA.

Example 9

As design data which may be obtained in a manufacturing part at a wafer manufacturing stage, only a guide pattern in DSA may be provided, and only a core pattern in SADP and SAQP may be provided. Particularly, in a case of a company which manufactures a semiconductor based on a consignment from a fabless (semiconductor corporation which does not have a factory) which is referred to as a foundry, data of a mask pattern (data of a pattern exposed on a sample) used in an exposure device can be obtained, but obtaining data of a pattern which is not shown in the mask pattern and is arranged within a guide pattern, or data of a pattern arranged by self alignment may be not possible.

In a case where pattern measurement for evaluating performance of a semiconductor device is performed in a foundry, a pattern formed by the DSA and the like is also one important evaluation target. However, if original design information is not present, performing adequate evaluation may be difficult. A device that adequately evaluates a pattern formed by the DSA and the like, even when original layout data is not present, and a computer program for performing the evaluation will be described below.

FIG. 28 illustrates an image generation example in a case where one hole is created from one DSA rectangular guide pattern. A guide pattern 2801 of design data, a hole shape 2803 created on a wafer, and a hole centroid 2804 are generated from DSA shape and size information.

The data of the guide pattern 2801 or the size information of the DSA is registered in the memory 805, for example, in advance, and is provided for computation of the pattern centroid computation portion 810. The guide pattern is a pattern projected by a contraction projection exposure device, and such pattern data is registered in the memory 805 in advance.

In the grid setting portion 809, a pitch X2805 and a pitch Y2806 are calculated from a plurality of patterns. A reference line X2807 and a reference line Y2808 are calculated from the pitch information.

FIG. 29 illustrates a display example of a measurement result. A measurement pattern position on an SEM image may be detected, for example, by template matching between design data 2909 for alignment and a pattern edge 2910 of the SEM image for alignment. A measurement pattern edge 2902 is detected from the SEM image, and a measurement pattern centroid 2903 is also calculated. Further, a deviated amount 2905 is also calculated from the reference line X2906 and the reference line Y2907. The calculated things are overlay-displayed on an image generated from the design data. As illustrated in FIG. 29, according to the example, even when data in which DSA pattern information like mask pattern data is omitted is provided, a measurement reference may be adequately set and as a result, a DSA pattern may be evaluated with high accuracy.

A method of generating a grid line in a case of using design data will be described with reference to FIG. 30. The computation processing device 803 reads design data stored in the design data storage medium 814 (S3001). The design data may be acquired by an external network or an external medium. Then, a user designates characteristic information of DSA/SADP/SAQP and the like from the input device 815 (S3002). The characteristic information corresponds to a value of a shape, a size, a pitch, or the like in a case of the DSA. In a case of the SADP/SAQP, the characteristic information corresponds to a value of the number of times of creating a spacer, a spacer width, and the like. The size or a position of a visual field is designated (S3003), a pattern shape and a centroid are generated (S3004). A pitch is calculated from a plurality of centroids (S3005). A grid line is generated by using the pitch (S3006). The generated grid line is displayed in a display device (S3007).

A product such as a centroid, a reference line, and a measurement pattern edge is output to the outside of the device in the same form as the design data. For example, a centroid coordinate is output by using a mark, a reference line coordinate is output by using a line, and a measurement pattern edge is output by using a polygon. Thus, analysis or feedback to the design data is easily performed.

Example 10

FIG. 31 illustrates an image generation example in a case where a plurality of holes is created from one DSA rectangular guide pattern. A hole shape 3103 and a hole centroid 3104 which are patterns created on a wafer are generated from a guide pattern 3101 of the design data and DSA shape and size information. In most cases, since DSA patterns are equivalently arranged within the guide pattern, setting can be performed by inputting one piece of pitch information. In a case where the pitch information is previously known, the pitch information is not required to be input. An adequate reference position may be set by setting shape information and size information of a pattern. A pitch X3105 and a pitch Y3106 are calculated based on centroid positions of a plurality of patterns which are set in the above-described manner. A reference line X3107 and a reference line Y3108 are calculated from the pitch information.

FIG. 32 illustrates a display example of the measurement result. A measurement pattern edge 3202 is detected from an SEM image, and a measurement pattern centroid 3203 is also calculated. A deviated amount 3205 is also calculated from a reference line X3206 and a reference line Y3207. The lines are overlay-displayed on an image generated from the design data.

According to the example, even in a case where a plurality of patterns within the guide pattern is assembled, it is possible to set a measurement reference at an adequate position, and as a result, to perform measurement with high accuracy.

Example 11

FIG. 33 illustrates an image generation example in a case where a plurality of holes is created from one DSA guide pattern which has a shape except for a rectangle. A hole shape 3303 and a hole centroid 3304 which are patterns created on a wafer are generated from a guide pattern 3301 of design data and DSA shape and size information. A pitch X3305 and a pitch Y3306 are calculated based on a plurality of patterns. A reference line X3307 and a reference line Y3308 are calculated from the pitch information.

FIG. 34 illustrates a display example of the measurement result. A measurement pattern edge 3402 is detected from an SEM image, and a measurement pattern centroid 3403 is also calculated. A deviated amount 3405 is also calculated from a reference line X3406 and a reference line Y3407. The lines are overlay-displayed on an image generated from the design data.

As described above, since the guide pattern has an L shape or other shapes in addition to a rectangular shape, arrangement conditions of a pattern in accordance with the shape of the guide pattern is stored in the memory 805 in advance, and thus the centroid of a pattern on the design data may be reproduced by inputting size information and the like of a DSA pattern. In the grid setting portion 809, the centroid position of a pattern on the design data is reproduced and is set as the measurement reference based on the arrangement conditions of the pattern, which are stored in the memory 805, the set size information of the pattern, and the like.

According to the above-described configuration, an operator can set a pattern centroid functioning as a measurement reference, at an adequate position, particularly, without being conscious of the shape of the guide pattern.

Example 12

FIG. 35 illustrates an image generation example in a case where a plurality of lines is created from one DSA rectangular guide pattern. A line shape 3503 and a line centroid 3504 which are patterns created on a wafer are generated from a guide pattern 3501 of design data and DSA shape and size information. A pitch X3505 is calculated based on a plurality of patterns. A reference line X3506 and a reference line Y3507 are calculated from the pitch information and the line centroid.

FIG. 36 illustrates a display example of the measurement result. A measurement pattern edge 3602 is detected from an SEM image, and a measurement pattern centroid 3603 is also calculated. A deviated amount 3608 is also calculated from a reference line X3606 and a reference line Y3607. The lines are overlay-displayed on an image generated from the design data.

Example 13

FIG. 37 illustrates an image generation example in a case where a plurality of lines is created from a core pattern of the SAQP (pattern which is patterned by the contraction projection exposure device). A 1st spacer 3702, a 1st spacer side wall 3703, a 2nd spacer 3704, and a 2nd spacer side wall 3705 which are patterns created on a wafer are generated from the core pattern 3701 of the design data and spacer width information of the SAQP, which is designated by a user.

FIG. 38 illustrates a pattern data generation method based on design data. A core pattern 3801 of the design data is expanded by an increase of the 1st spacer width, and thereby a 1st spacer 3802 is generated. The 1st spacer 3802 is removed from the 1st spacer 3802, and thereby a 1st spacer side wall 3803 is generated. The 1st spacer side wall 3803 is expanded by an increase of the 2nd spacer width, and thereby a 2nd spacer 3804 is generated. The 1st spacer side wall 3803 is removed from the 2nd spacer 3804, and thereby a 2nd spacer side wall 3805 is generated.

FIG. 39 illustrates an example of a generation method after cutting. A cutting pattern 3901 of design data is removed from the 2nd spacer side wall 11202, and thereby an SAQP pattern 3903 is generated. A line centroid 3904 is calculated from an SAQP pattern 3903. A reference line X3905 and a reference line Y3906 are calculated from a plurality of line centroids. Since there is no 2nd spacer in the SADP, the process for the 2nd spacer may not be performed.

For example, centroid positions (centroid positions of S2 and S6) of space patterns illustrated in FIG. 23 are superposed on line centroids corresponding to centroid positions of S2 and S6 within a line centroid 3904, which are obtained as described above, and deviation between other centroid positions is measured. Thus, it is possible to adequately evaluate process change derived from the multi-patterning.

When superposition of both of the centroid positions S2 and S6 are not adequately performed, since pattern deviation due to a photomask or process conditions in the exposure process and the like, not in the multi-patterning process may occur, for example, position alignment is performed between centroid positions of one of S2 and S6, and deviation between another centroid positions is evaluated. Thus, it is possible to evaluate pattern deviation derived from a process before the multi-patterning. Further, in a case where the pattern deviation derived from the multi-patterning is evaluated, for example, position alignment between reference image data and a measurement target image derived from an SEM image is executed so as to cause an added value of deviation between centroid positions of S2 and deviation between centroid positions of S6 to be smallest. In this state, deviation between other centroid positions (for example, between centroid positions except for S2 and S6) is evaluated, and thus it is possible to evaluate the deviation derived from the multi-patterning process.

Example 14

FIG. 48 illustrates a screen example in which a user sets characteristic information. The user can set a shape of a high-molecular compound by using a selection box 4801. A pattern width of a high-molecular compound may be set by using an input box 4802. A pitch width of a high-molecular compound may be set by using an input box 4803.

FIG. 49 illustrates a generation example of the DSA pattern. A pattern width 4903 of the set high-molecular compound is generated within a guide pattern 4901 of design data. An image having a pattern shape is generated at the point of a pitch width 4903. A pitch width is applied to a guide pattern around a pattern or other DSA patterns.

REFERENCE SIGNS LIST

101 ELECTRON SOURCE
102 EXTRACTION ELECTRODE
103 PRIMARY ELECTRON BEAM (CHARGED PARTICLE BEAM)
104 FIRST CONDENSER LENS
105 DIAPHRAGM
106 SECOND CONDENSER LENS
107 SECONDARY ELECTRON DETECTOR
108 ALIGNMENT COIL
109 DEFLECTION COIL
110 OBJECTIVE LENS
111 SAMPLE
112 STAGE
113 SAMPLE CHAMBER
114 SECONDARY ELECTRON
115 HIGH-VOLTAGE CONTROL DEVICE
116 FIRST CONDENSER LENS CONTROL UNIT
117 SECOND CONDENSER LENS CONTROL UNIT
118 SECONDARY ELECTRON SIGNAL AMPLIFIER
119 ALIGNMENT CONTROL UNIT
120 DEFLECTION SIGNAL AMPLIFIER
121 OBJECTIVE LENS CONTROL UNIT
122 DEFLECTION SIGNAL CONTROL UNIT
123 IMAGE PROCESSING PROCESSOR
124 SECONDARY ELECTRON IMAGE DISPLAY DEVICE

The invention claimed is:

1. A pattern measurement device comprising:
a computation device that measures dimensions between patterns formed in a sample, by using data which is obtained by irradiating the sample with a beam,
wherein
the computation device specifies a center of a space between patterns formed in the sample, from data to be measured obtained by irradiation with the beam,
sets measurement references, which are separate from the patterns, in a grid shape at a plurality of positions whose distances from the specified center correspond to edge positions of patterns determined by a design data with the specified center as a reference, and
measures dimensions between the set measurement references and the edges extracted from data obtained by irradiation with the beam.

2. The pattern measurement device according to claim 1, wherein
a plurality of the measurement start points or the measurement end points is arranged at a predetermined interval.

3. The pattern measurement device according to claim 2, wherein
the plurality of the measurement start points or the measurement end points is separately arranged at an interval between patterns generated by a self-derivative assembly process, or at an interval between patterns generated by a multi-patterning method.

4. The pattern measurement device according to claim 1, wherein
a position-aligned reference position obtained by position alignment between the measurement reference data and the centroid is set in the measurement reference data, and
the measurement start point or the measurement end point is set based on position alignment of the position-aligned reference position.

5. The pattern measurement device according to claim 4, wherein
the computation device executes the position alignment process by using a centroid position of a pattern generated by a self-derivative assembly process, as the position-aligned reference position.

6. The pattern measurement device according to claim 4, wherein the computation device executes the position alignment process by using a centroid position of a space between patterns generated by a multi-patterning method, as the position-aligned reference position.

7. A non-transitory computer-readable medium storing a program which, when executed on a computer, causes the computer to measure dimensions between patterns formed in a sample, by using data which is obtained by irradiating the sample with a beam, wherein the program causes the computer to specify a center of a space between the patterns formed in the sample, from data to be measured obtained by irradiation with the beam, to set measurement references, which are separate from the patterns, in a grid shape at a plurality of positions whose distances from the specified center correspond to edge positions of patterns determined by a design data with the specified center as a reference, and to measure dimensions between the set measurement references and the edges extracted from data obtained by irradiation with the beam.

8. A pattern measurement device comprising:

a computation device that measures dimensions between patterns formed in a sample, by using data which is obtained by irradiating the sample with a beam, wherein the computation device acquires pattern data formed by patterning with a contraction projection exposure device, specifies a center of a space between the patterns formed in the sample, sets measurement references, which are separate from the patterns, in a grid shape at a plurality of positions whose distances from the specified center correspond to edge positions of patterns determined by a design data with the specified center as a reference, and measures dimensions between the set measurement references and the edges extracted from data obtained by irradiation with the beam.

9. The pattern measurement device according to claim 8, wherein the pattern data is guide pattern data used in the self-derivative assembly process.

10. The pattern measurement device according to claim 8, wherein the pattern data is core pattern data applied to the multi-patterning method.

11. A non-transitory computer-readable medium storing a program which, when executed on a computer, causes the computer to measure dimensions between patterns formed in a sample, by using data which is obtained by irradiating the sample with a beam, wherein the program causes the computer to acquire pattern data formed by patterning with a contraction projection exposure device, specify a center of a space between the patterns formed in the sample, set measurement references, which are separate from the patterns, in a grid shape at a plurality of positions whose distances from the specified center correspond to edge positions of patterns determined by a design data with the specified center as a reference, and measures dimensions between the set measurement references and the edges extracted from data obtained by irradiation with the beam.

* * * * *